United States Patent

Seto et al.

[11] Patent Number: 6,154,954
[45] Date of Patent: Dec. 5, 2000

[54] ELECTRONIC COMPONENT-MOUNTING APPARATUS AND MOUNTING HEAD DEVICE THEREFOR

[75] Inventors: Katsuyuki Seto; Masayuki Mohara; Kazuhiro Hineno, all of Gunma-ken, Japan

[73] Assignee: Sanyo Electric Co., Ltd., Osaka-fu, Japan

[21] Appl. No.: 08/874,957

[22] Filed: Jun. 13, 1997

[30] Foreign Application Priority Data

Jul. 25, 1996 [JP] Japan .................................. 8-214345

[51] Int. Cl.⁷ ................................................ B23P 19/00
[52] U.S. Cl. ............................... 29/740; 29/741; 29/743; 294/64.1; 414/737; 414/752; 90/40
[58] Field of Search .............. 29/740, 741, 743, 29/766; 414/737, 752; 294/64.1; 901/40

[56] References Cited

U.S. PATENT DOCUMENTS

| | | | |
|---|---|---|---|
| 4,868,973 | 9/1989 | Fujishiro | 29/740 |
| 5,033,185 | 7/1991 | Hidese | 29/740 |
| 5,153,983 | 10/1992 | Oyama | 29/740 |
| 5,233,745 | 8/1993 | Morita | 29/705 |
| 5,265,330 | 11/1993 | Sakaguchi | 29/836 |
| 5,402,564 | 4/1995 | Tsukasaki et al. | 29/832 |
| 5,544,411 | 8/1996 | Kano et al. | 29/740 |
| 5,566,447 | 10/1996 | Sakurai | 295/832 |

*Primary Examiner*—Lee Young
*Attorney, Agent, or Firm*—Darby & Darby

[57] ABSTRACT

A component-mounting block of an electronic component-mounting apparatus has mounting heads installed thereon. Each mounting head has a nozzle-replacing device for replacing at least one selected sucking nozzle by at least one other sucking nozzle to be newly selected. The replacement is possible during travel of the component-mounting block between a mounting position and a sucking position effected by a X-Y moving stage. At least one mounting head carries at least one sucking nozzle rotatable about a vertical axis of a nozzle holder. The mounting head has the nozzle holder, and an engaging member holder. Sucking nozzles are circumferentially arranged about the vertical axis of the nozzle holder and vertically retractably held by the nozzle holder. The engaging member holder holds engaging members which engageably face the nozzles. The nozzles are engaged with the engaging members when the holders are relatively vertically moved toward each other, and are retracted when the holders are moved away from each other. The engagement can be prevented. A selected engaging member is prevented from engaging with a corresponding sucking nozzle by rotating the holders about the vertical axis. Alternatively, at least one nozzle is disengaged from a corresponding engaging member at a desired rotational angle of the holders.

20 Claims, 15 Drawing Sheets

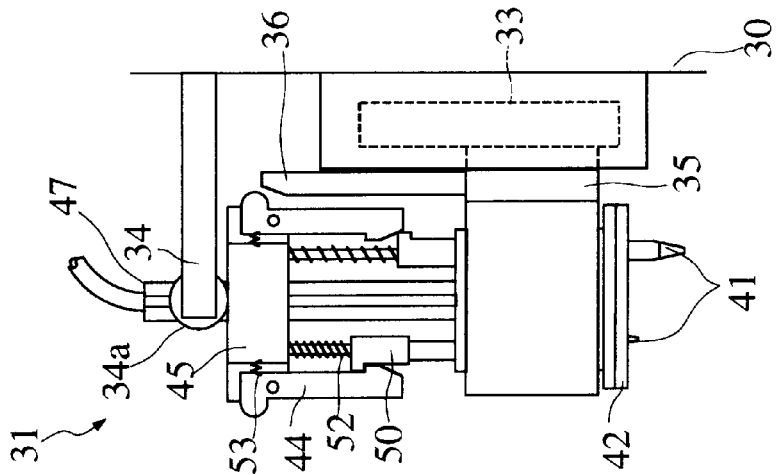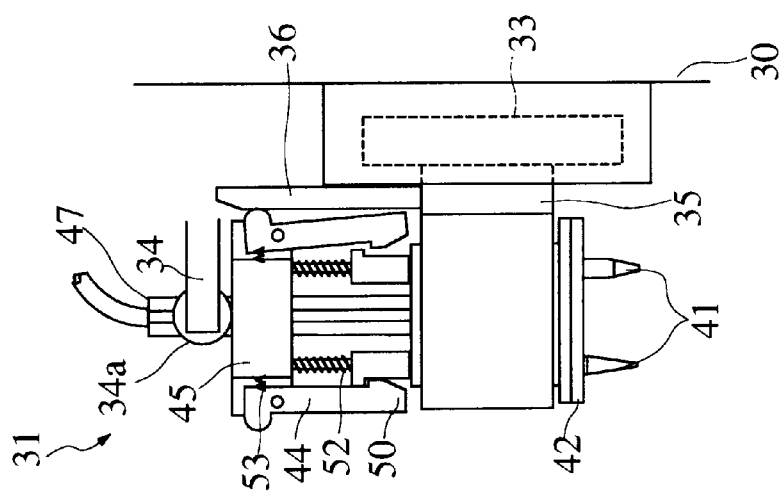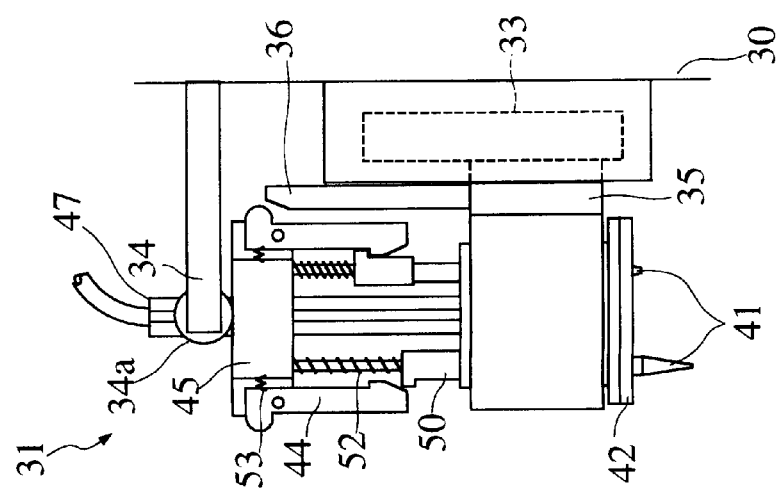

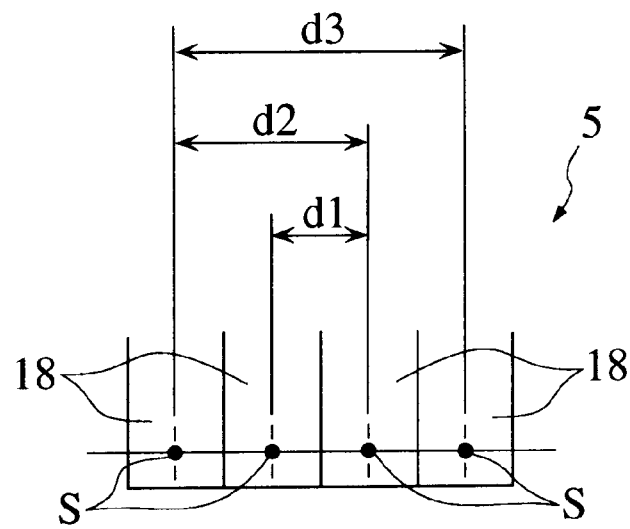
F I G. 9 A
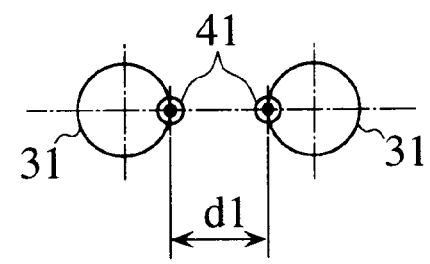
F I G. 9 B
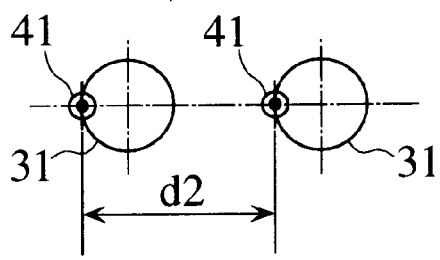
F I G. 9 C
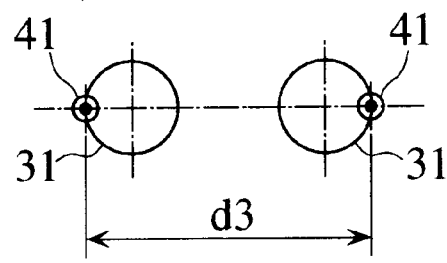
F I G. 9 D

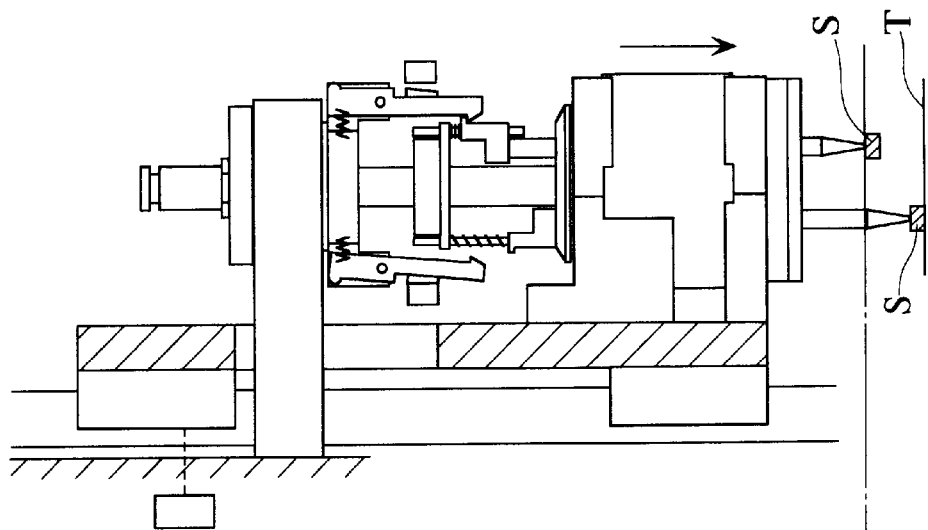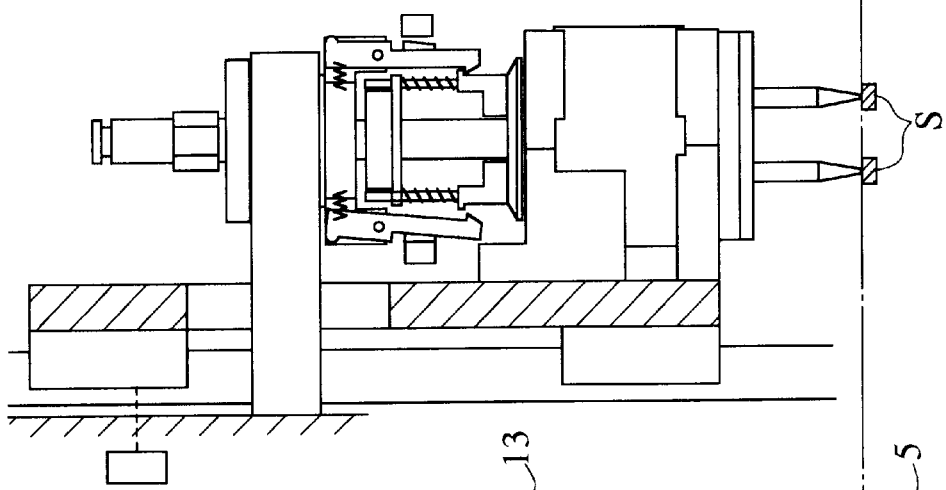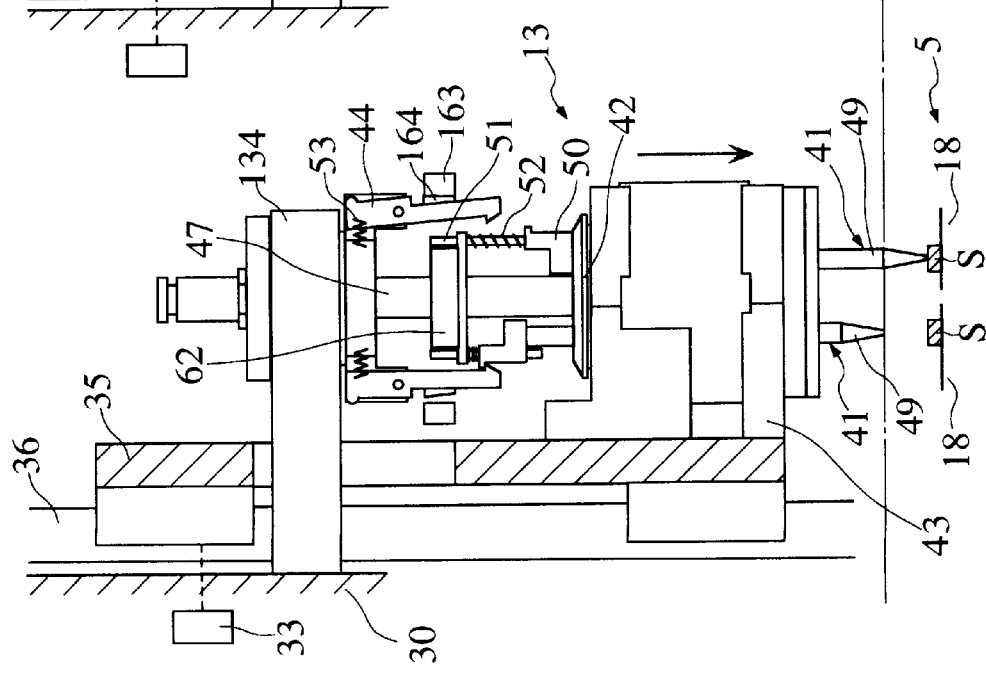

ELECTRONIC COMPONENT-MOUNTING APPARATUS AND MOUNTING HEAD DEVICE THEREFOR

BACKGROUND OF THE INVENTION

1. Field of the Invention

This invention relates to an electronic component-mounting apparatus of multi-function type for mounting various kinds of electronic components on a circuit board, and a mounting head device installed on the electronic component-mounting apparatus.

2. Prior Art

Conventionally, an electronic component-mounting apparatus of this kind has been proposed by Japanese Laid-Open Patent Publication (Kokai) No. 4-35095, which includes a sucking nozzle for sucking an electronic component, a mounting head carrying the sucking nozzle, an elevating device for vertically moving the sucking nozzle, and an X-Y stage for moving the mounting head in an X-axis direction and a Y-axis direction on a horizontal plane. Further, the electronic component-mounting apparatus includes a nozzle storage device for holding a plurality of kinds of sucking nozzles in stock for selective use to make the mounting head adapted to various kinds of electronic components. The mounting head carries a single sucking nozzle, which can be replaced at the nozzle storage device by one suitable for an electronic component to be mounted.

FIG. 1 schematically shows operations of the electronic component-mounting apparatus constructed as above. The figure illustrates a case in which an electronic component sucked at a point A of a component-feeding block 101 is mounted at a point P1 of a circuit board 102, and then an electronic component sucked at a point B of the component-feeding block 101 is mounted at a point P2 of the circuit board 102. First, the X-Y stage 103 moves the mounting head 104 from its home position to a position exactly above the point A, and then the elevating device 105 lowers the sucking nozzle to suck the electronic component at the point A. After sucking the electronic component, the elevating device 105 lifts the sucking nozzle, and the X-Y stage moves the mounting head 104 from the point A to a position exactly above the point P1. Then, the sucking nozzle is lowered again to mount the same at the point P1.

The mounting head 104 is then moved to the point B to suck an electronic component and mount the same at the point P2 of the circuit board 102. In doing this, if the same sucking nozzle as employed for the immediately preceding electronic component can suitably handle the present electronic component, the same procedure as described above is carried out to mount the electronic component. However, if the electronic component supplied at the point B cannot be handled by the same sucking nozzle, the mounting head 104 is once moved to the nozzle storage device 106, where the sucking nozzle is replaced by one suitable for the present electronic component. The mounting head 104 is then moved to the point B to thereafter carry out the same mounting operations as described above.

On the other hand, Japanese Laid-Open Patent Publication (Kokai) No. 5-226884 discloses an electronic component-mounting apparatus of rotary type, which includes mounting heads each carrying a plurality of sucking nozzles. The sucking nozzles of the mounting head are arranged along the circumference of the mounting head at equally-spaced intervals such that each of them is capable of projecting and retracting, and as a whole rotating about the vertical axis of the mounting head 104. The sucking nozzles are each urged by a coiled spring in a projecting direction, with an engaging member being arranged for an upper portion of each of the sucking nozzles for holding the same in a retracted position. Each engaging member is pivotally movable between a position for engagement with a sucking nozzle associated therewith and a position for disengagement therefrom, and urged by a spring in an engaging direction.

That is, when each sucking nozzle is retracted against the urging force of the coiled spring, it is brought into engagement with the engaging member to be held in the retracted position. Inversely, when the sucking nozzle is disengaged from the engaging member, it is brought into a projected position by the coiled spring. Therefore, in changing (replacing) sucking nozzles, the mounting head is lowered to cause the sucking nozzle to strike against a flat stopper whereby all the sucking nozzles are once retracted, and then as the mounting head is lifted, an arm extending from the body of the apparatus prevents engagement of a selected sucking nozzle with an engaging member associated therewith.

In the conventional electronic component-mounting apparatus, as more kinds of electronic components are to be mounted on one circuit board, sucking nozzles are changed more often. In other words, the mounting head 104 is more frequently moved to the nozzle storage device 106 for replacement of sucking nozzles. Particularly, it takes time to change sucking nozzles since it involves moving of the mounting head 104 before the sucking nozzle is removed therefrom and a new sucking nozzle is mounted thereon, so that, as a whole, the tact time of mounting electronic components on the circuit board 102 is increased.

Further, in the mounting head used in the electronic component-mounting apparatus disclosed in Japanese Laid-Open Patent Publication (Kokai) No. 5-226884, the stopper is necessitated for changing sucking nozzles, and horizontal motion of the mounting head has to be interrupted so as to lower the mounting head and then lift it up.

SUMMARY OF THE INVENTION

It is a first object of the invention to provide an electronic component-mounting apparatus which is capable of reducing tact time of mounting a plurality of kinds of electronic components on a circuit board.

It is a second object of the invention to provide a mounting head device which is capable of replacing sucking nozzles with ease during horizontal motion thereof.

To attain the first object, according to a first aspect of the invention, there is provided an electronic component-mounting apparatus for sucking electronic components and mounting the electronic components on a circuit board, the electronic component-mounting apparatus comprising:

a component-feeding block for feeding a plurality of electronic components to a sucking position;

a component-mounting block for selectively sucking at least one of the electronic components at the sucking position of the component-feeding block, and mounting the at least one of the electronic components having been sucked, on a circuit board at a mounting position, the component-mounting block having a plurality of mounting heads installed thereon, each of the plurality of mounting heads having:

a plurality of sucking nozzles for sucking a corresponding one of the electronic components, and a nozzle-replacing device for effecting replacement of at least one selected sucking nozzle of the plurality of sucking nozzles by at least one other sucking nozzle of the plurality of sucking nozzles to be newly selected; and an X-Y moving stage for moving the component-mounting block between the sucking position and the mounting position, wherein the nozzle-replacing device is capable of the replacement of the at least one selected sucking nozzle of the plurality of sucking nozzles by the at least one other sucking nozzle of the plurality of sucking nozzles to be newly selected, during travel of the component-mounting block between the mounting position and the sucking position effected by the X-Y moving stage.

According to this electronic component-mounting apparatus of the first aspect of the invention, since the mounting head carries a plurality of sucking nozzles, it is possible to use the plurality of sucking nozzles adaptively for a plurality of kinds of electronic components, which leads to decrease in frequency of replacing sucking nozzles. Further, since the nozzle-replacing device is capable of selectively replacing at least one of the plurality of sucking nozzles during travel of the component-feeding block by the X-Y moving stage, time required replacement of sucking nozzles can be reduced. Moreover, since the component-mounting block has the plurality of mounting heads installed thereon, frequency of replacing sucking nozzles is further decreased. If as many mounting heads as possible (preferably all mounting heads) suck electronic components at the component-feeding block, the frequency of travel of the component-mounting blocks by the X-Y moving stage per number of electronic components to be mounted can be markedly decreased, whereby the whole tact time of mounting electronic components can be reduced.

Preferably, the nozzle-replacing device lifts upward the at least one selected sucking nozzle and projects downward the at least one other sucking nozzle to be newly selected, to thereby replace the former by the latter.

According to this preferred embodiment, it is possible to selectively replace sucking nozzles by vertical movement thereof, so that there is no fear of sucking nozzles interfering with other component parts of the apparatus during travel of the mounting head. This enables sucking nozzles to be selected or replaced in a simple manner in a short time period. Further, the whole mounting head can be vertically moved by the use of a device for vertically moving the sucking nozzles.

Still preferably, the each of the mounting heads has a nozzle holder which has the plurality of sucking nozzles arranged circumferentially about a vertical axis thereof, and an electric motor for rotating the nozzle holder about the vertical axis thereof.

According to this preferred embodiment, the mounting head is capable of rotating a plurality of sucking nozzles, by itself, i.e. by means of the motor and the nozzle holder both incorporated in the mounting head, whereby it is possible to effect fine correction of positions of the sucking nozzles before electronic components are sucked, so as to make the positions of the sucking nozzles suitable for actual positions of the electronic components to be sucked. Further, the rotation of the nozzle holder can be also utilized in selective replacement of the sucking nozzles.

Preferably, the component-mounting block has elevating means for vertically moving each of the plurality of mounting heads such that the each of the mounting heads is vertically moved with reference to a level of a bottom surface of each of the respective electronic components having been sucked by the each of the mounting heads.

According to this construction, since the mounting head is vertically moved with reference to a level of the bottom surface of each electronic component sucked, the bottom surface of each of electronic components can be always set to a fixed level even if they are different in thickness, whereby it is possible to recognize each component with accuracy by a component-sensing camera.

Preferably, the component-feeding block has means for feeding the plurality of electric components in an aligned manner at intervals of an identical distance, thereby permitting a plurality of ones of the plurality of electronic components to be selectively simultaneously sucked, and the component-mounting block has the plurality of mounting heads installed thereon in parallel with the plurality of electronic components arranged in the aligned manner, in a manner such that a pitch of arrangement of the plurality of mounting heads is an integral multiple of the identical distance.

According to this preferred embodiment, a plurality of electronic components to be sucked and a plurality of mounting heads for sucking desired ones of the electronic components are positioned in a manner opposed to and parallel with each other, and a pitch of arrangement of the mounting heads proportionately agrees with a pitch of arrangement of the electronic components. Therefore, it is possible to simultaneously suck the plurality of desired electronic components by the plurality of mounting heads. Although the simultaneous sucking of a plurality of electronic components requires coincidence between the arrangement of electronic components to be mounted on a circuit board and that of electronic components to be sucked at the component-feeding block, the increased frequency of simultaneous sucking of electronic components contributes to reduction in tact time of mounting electronic components.

Further preferably, the each of the mounting heads has a nozzle holder which has the plurality of sucking nozzles arranged circumferentially about a vertical axis thereof, and an electric motor for rotating the nozzle holder about the vertical axis, the sucking nozzles each rotating on a circular path of rotation having a diameter larger than the identical distance of the plurality of electronic components.

According to this preferred embodiment, one mounting head is capable of rotating sucking nozzles thereof to thereby select and suck either of two electronic components. This makes it possible to further increase the possibility and hence frequency of simultaneous sucking of electronic components.

Preferably, the component-feeding block feeds a plurality of kinds of electronic components, and the plurality of mounting heads each have a plurality of sucking nozzles corresponding to a plurality of selected kinds of the plurality of kinds of electronic components.

To attain the first object, according to a second aspect of the invention, there is provided an electronic component-mounting apparatus for sucking electronic components and mounting the electronic components on a circuit board, the electronic component-mounting apparatus comprising:

a component-feeding block for feeding a plurality of electronic components to a sucking position;

a component-mounting block for selectively sucking at least one of the electronic components at the sucking position of the component-feeding block, and mounting the at least one of the electronic components having been sucked, on a circuit board at a mounting position, the component-mounting block each having a plurality of mounting heads installed thereon, at least one of the plurality of mounting heads having at least one sucking nozzle mounted thereon in a manner rotatable about a vertical axis of the mounting head; and an X-Y moving stage for moving the component-mounting block between the sucking position and the mounting position.

According to this electronic component-mounting apparatus of the second aspect of the invention, the at least one mounting head is capable of decreasing frequency of replacing sucking nozzles carried thereon by other sucking nozzles. The apparatus is also capable of correcting positions of sucking nozzles relative to respective electronic components to be sucked and simultaneously sucking electronic components.

To attain the first object, according to a third aspect of the invention, there is provided an electronic component-mounting apparatus for sucking electronic components and mounting the electronic components on a circuit board, the electronic component-mounting apparatus comprising:

a component-feeding block for feeding at least one electronic component to a sucking position; and a mounting head for selectively sucking at least one of the at least one electronic component at the sucking position of the component-feeding block and then moving on a horizontal plane to mount the at least one electronic component having been sucked, on a circuit board at a mounting position, the mounting head having:

a nozzle holder, a plurality of sucking nozzles arranged along an identical circle about a vertical axis of the nozzle holder and held by the nozzle holder in a manner capable of projecting and retracting vertically, an engaging member holder, a plurality of engaging members each held by the engaging member holder in a manner engageable with the plurality of sucking nozzles, respectively, rotating means for rotating the nozzle holder and the engaging member holder about the vertical axis of the nozzle holder, elevating means for vertically moving the nozzle holder and the engaging member holder away from each other, to thereby retract ones of the sucking nozzles in engagement with corresponding ones of the engaging members into the nozzle holder, and disengaging means for disengaging at least one of the plurality of sucking nozzles and a corresponding one of the engaging members from each other at an arbitrary desired rotational angle position of the nozzle holder and the engaging member holder.

According to this electronic component-mounting apparatus, the nozzle holder holds a plurality of sucking nozzles arranged along the identical circle around the vertical axis thereof such that they are capable of projecting and retracting vertically, while the engaging member holder holds a plurality of engaging members in a manner each engageable with one of the plurality of sucking nozzles. The disengaging means disengages at least one of the plurality of sucking nozzles from an engaging member at an arbitrary desired rotational angle position of the nozzle holder and the engaging member holder. Accordingly, when the nozzle holder and the engaging member holder are vertically moved away from each other by the elevating means, in a state in which one of the nozzles has been disengaged from an corresponding engaging member by the disengaging means, the sucking nozzle disengaged from the engaging member moves to follow the movement of the nozzle holder to be held in a state projected from the nozzle holder, while the other sucking nozzles are prevented from moving by the engagement with the corresponding engaging members and hence retracted into the nozzle holder.

As described above, it is possible to project only the sucking nozzle selectively disengaged from the engaging member from the nozzle holder by vertically moving the nozzle holder and the engaging member holder toward each other and away from each other by the elevating means, to thereby carry out sucking and mounting of electronic components. Further, the disengaging means enables a sucking nozzle to be instantly disengaged from a corresponding engaging member regardless of a rotational angle position of the nozzle holder and the engaging member holder. This makes it possible to shorten time required for disengagement between a sucking nozzle and an engaging member compared with a case where the disengagement is carried out by rotating and positioning the nozzle holder and the engaging member holder, so that tact time of mounting electronic components on a circuit board can be the further reduced.

Moreover, since a plurality of sucking nozzles are arranged along an identical circle around the vertical axis about which the nozzle holder and the engaging member holder rotate, the disengaging means can have a relatively simple construction.

Preferably, the disengaging means is capable of simultaneously disengaging at least two of the plurality of sucking nozzles from corresponding ones of the engaging members.

According to this preferred embodiment, the disengaging means is capable of simultaneously disengaging more than one sucking nozzles from corresponding engaging members, so that particularly when electronic components are simultaneously sucked by a plurality of sucking nozzles, time required for selective projection or replacement of sucking nozzles is further shortened, and hence the tact time of mounting the electronic components can be also reduced.

Preferably, the plurality of sucking nozzles comprise four sucking nozzles arranged circumferentially at intervals of an identical distance.

According to this preferred embodiment, since the four sucking nozzles are arranged along an identical circle at angular intervals of 90 degrees about the vertical axis of the nozzle holder, it is possible to further simplify the arrangement of the disengaging means, and at the same time rotate the nozzle holder about the same vertical axis to thereby easily position and correct positions of the sucking nozzles before simultaneously sucking a plurality of electronic components by the plurality of sucking nozzles from component-feeding blocks arranged in parallel with each other.

Preferably, each of the plurality of engaging members is held by the engaging member holder in a manner pivotally movable about a horizontal pivot thereof and urged in an engaging direction for engagement with a corresponding one of the sucking nozzles, the each of the engaging members having at least part of an outer surface thereof formed by a magnetic substance, the disengaging means having a plurality of electromagnets arranged circumferentially in a manner opposed to the magnetic substance of the each of the engaging members, for pivotally moving a selected one of the engaging members in a direction opposite to the engaging direction when one of the electromagnets corresponding to the selected one of the engaging members is excited, to thereby attract the selected one of the engaging members by way of the magnetic substance thereof, and electromagnet control means for controlling magnetization/demagnetization of the plurality of electromagnets independently of each other.

According to this preferred embodiment, the electromagnet control means controls magnetization (excitation) and demagnetization of the plurality of electromagnets independently of each other, and an electromagnet excited (magnetized) by the electromagnet control means exerts magnetic force thereof on a magnetic substance of an engaging member opposed thereto, to thereby pivotally move the engaging member in a direction opposite to the engaging direction. This pivotal movement of the engaging member, i.e. attraction of the engaging member by the electromagnet disengages the engaging member from the corresponding sucking nozzle, and reliably maintains the disengaged state of the engaging member from the sucking nozzle. Thus, simply by exciting (magnetizing) an electromagnet corresponding to a sucking nozzle to be selected, the sucking nozzle can be easily disengaged from an corresponding engaging member, regardless of a rotational angle position of the nozzle holder and the engaging member holder, and the disengaged state of the sucking nozzle can be maintained. Further, it is possible to simultaneously disengage a plurality of sucking nozzles from corresponding engaging members by simultaneously exciting a plurality of electromagnets, respectively.

Further preferably, the plurality of electromagnets are formed by electromagnets larger in number than a number of the plurality of sucking nozzles.

According to this preferred embodiment, even when one engaging member is in a position opposed to two electromagnets at the same time depending on the rotational angle positions of the nozzle holder and the engaging member holder, it is possible to positively disengage the engaging member from a sucking nozzle by exciting (magnetizing) the two electromagnets simultaneously, and the other engaging members can also be disengaged from respective sucking nozzles independently of each other by exciting selected ones of the other electromagnets, if required.

Preferably, each of the plurality of engaging members is held by the engaging member holder in a manner pivotally movable about a horizontal pivot thereof and urged in an engaging direction for engagement with a corresponding one of the sucking nozzles, the engaging members having a plurality of rotatable rollers, respectively, the disengaging means having a cam which is rotatable about the vertical axis of the nozzle holder in sliding contact with the plurality of rollers, the cam being formed with a plurality of protruding portions on a sliding surface thereof in sliding contact with the rollers, for pivotally moving selected one of the engaging members in a direction opposite to the engaging direction when one of the rotatable rollers of the selected one of the engaging members is brought into contact with one of the protruding portions of the cam, and cam-driving means for moving the cam to a desired rotational angle position.

According to this preferred embodiment, the cam is rotated about the vertical axis of the nozzle holder in sliding contact with the plurality of rollers to bring one of the plurality of protruding portions formed on the sliding surface of the cam into contact with one of the plurality of rollers, whereby an engaging member having the roller is pivotally moved in the direction opposite to an engaging direction. This pivotal movement of the engaging member disengages the engaging member and the sucking nozzle from each other. Further, it is possible to simultaneously disengage a plurality of sucking nozzles from a plurality of engaging members with ease by bringing a plurality of protruding portions into contact with a plurality of rollers simultaneously.

Still preferably, the plurality of sucking nozzles are formed by four sucking nozzles arranged circumferentially at intervals of an identical distance, and the plurality of protruding portions of the cam are formed by two protruding portions formed at diametrically opposite locations thereof and one other protruding portion formed at a location other than locations circumferentially spaced from the two protruding portions by an angle of 90 degrees.

According to this preferred embodiment, it is possible to position and/or correct positions of a plurality of sucking nozzles with ease when a plurality of electronic components are to be simultaneously sucked by corresponding ones of the sucking nozzles. Further, in the case where the two protruding portions formed at diametrically opposite locations on the cam are brought into contact with two engaging members engaged with two sucking nozzles at the diametrically opposite locations, it is possible to simultaneously disengage the two sucking nozzles from the two engaging members, while in the case where the one other protruding portion is brought into contact with a roller corresponding to one sucking nozzle, the two other protruding portions are moved out of contact with other rollers, and hence the one sucking nozzle alone is disengaged from the corresponding engaging member. Thus, it is possible to selectively carry out simultaneous disengagement of two sucking nozzles from corresponding engaging members and disengagement of one sucking nozzle from a corresponding engaging member.

To attain the first object, according to a fourth aspect of the invention, there is provided an electronic component-mounting apparatus for sucking electronic components and mounting the electronic components on a circuit board, the electronic component-mounting apparatus comprising:

a component-feeding block for feeding a plurality of electronic components to a sucking position;

a component-mounting block for selectively sucking at least one of the electronic components at the sucking position of the component-feeding block, and mounting the at least one of the electronic components having been sucked, on a circuit board at a mounting position, the component-mounting block having a plurality of mounting heads installed thereon; and an X-Y moving stage for moving the component-mounting block between the sucking position and the mounting position, each of the mounting heads having:
a nozzle holder,
a plurality of sucking nozzles arranged along an identical circle about a vertical axis of the nozzle holder and held by the nozzle holder in a manner capable of projecting and retracting vertically,
an engaging member holder,
a plurality of engaging members each held by the engaging member holder in a manner engageable with the plurality of sucking nozzles, respectively,
rotating means for rotating the nozzle holder and the engaging member holder about the vertical axis of the nozzle holder,
elevating means for vertically moved the nozzle holder and the engaging member holder away from each other, to thereby retract ones of the sucking nozzles in engagement with corresponding ones of the engaging members into the nozzle holder, and
disengaging means for disengaging at least one of the plurality of sucking nozzles and a corresponding one of the engaging members from each other at an arbitrary desired rotational angle position of the nozzle holder and the engaging member holder.

The electronic component-mounting apparatus according to the fourth aspect of the invention provides the same effects as obtained by the apparatus according to the third aspect of the invention. In addition, since the component-mounting block of the present apparatus has the plurality of mounting heads installed thereon, it is possible to further decrease the frequency of replacing sucking nozzles.

To attain the second object, according to a fifth aspect of the invention, there is provided a mounting head device for an electronic component-mounting apparatus comprising:

a nozzle holder;

a plurality of sucking nozzles arranged circumferentially about a vertical axis of the nozzle holder and held by the nozzle holder in a manner capable of projecting and retracting vertically;

an engaging member holder;

a plurality of engaging members each held by the engaging member holder in a manner engageable with the plurality of sucking nozzles, respectively;

elevating means for relatively moving the nozzle holder and the engaging member holder in vertically opposite directions, to thereby engage the engaging members with the sucking nozzles, respectively, when the nozzle holder and the engaging member holder are moved toward each other, and retract the sucking nozzles into the nozzle holder when the nozzle holder and the engaging member holder are moved away from each other;

disengaging means for preventing engagement between a selected one of the engaging members and a corresponding one of the sucking nozzles when the nozzle holder and the engaging member holder are moved toward each other, in a state of the disengaging means being opposed to the selected one of the engaging members; and rotating means for rotating the nozzle holder and the engaging member holder about the vertical axis of the nozzle holder to thereby move the selected one of the engaging members to a position opposed to the disengaging means.

According to this mounting head device, the nozzle holder and the engaging member holder are rotated about the vertical axis of the nozzle holder to thereby bring an engaging member to be engaged with a sucking nozzle to be projected (selected) to a position opposed to the disengaging means, and thereafter the nozzle holder and the engaging member holder are moved vertically toward each other by the elevating means. Through this operation, all the sucking nozzles are once lifted up to a retracted position, with only the selected sucking nozzle being prevented from engagement with an engaging member corresponding thereto. Then, when the nozzle holder and the engaging member holder are relatively moved vertically away from each other, the selected sucking nozzle projects downward from the nozzle holder. Thus, the mounting head device is capable of selectively replacing sucking nozzles by itself without any help of a jig or the like.

Preferably, the nozzle holder having a vertical shaft, the engaging member holder being in spline engagement with the vertical shaft of the nozzle holder, and the rotating means comprises an electric motor having the nozzle holder as a rotor.

According to this preferred embodiment, it is possible to rotate the engaging member holder and the nozzle holder simultaneously in a state permitting relative vertical movement of the engaging member holder with respect to the nozzle holder. Further, since the rotating means comprises an electric motor having the nozzle holder as a rotor, it is possible to construct a mounting head device which is compact in size and capable of rotating smoothly without shaking.

To attain the second object, according to a sixth aspect of the invention, there is provided a mounting head device for an electronic component-mounting apparatus, comprising:

a nozzle holder;

a plurality of sucking nozzles arranged along an identical circle about a vertical axis of the nozzle holder and held by the nozzle holder in a manner capable of projecting and retracting vertically;

an engaging member holder;

a plurality of engaging members each held by the engaging member holder in a manner engageable with the plurality of sucking nozzles, respectively;

rotating means for rotating the nozzle holder and the engaging member holder about the vertical axis of the nozzle holder;

elevating means for vertically moving the nozzle holder and the engaging member holder away from each other, to thereby retract ones of the sucking nozzles in engagement with corresponding ones of the engaging members into the nozzle holder; and disengaging means for disengaging at least one of the plurality of sucking nozzles and a corresponding one of the engaging members from each other at an arbitrary desired rotational angle position of the nozzle holder and the engaging member holder.

The mounting head device according to the sixth aspect of the invention provides the same effects as obtained by the electronic component-mounting apparatus according to the third aspect of the invention.

The above and other objects, features, and advantages of the invention will become more apparent from the following detailed description taken in conjunction with the accompanying drawings.

BRIEF DESCRIPTION OF THE DRAWINGS

FIGS. 4A to 4C are side elevations of the mounting head and component parts associated therewith, which are useful in explaining how a sucking nozzle is selected or replaced;

FIGS. 9A to 9D are plan views illustrating patterns of positions of sucking nozzles selected for simultaneously sucking electronic components;

FIGS. 14A to 14C are side elevations of the mounting head which are useful in illustrating operations of the mounting head;

DETAILED DESCRIPTION

The invention will now be described in detail with reference to the drawings showing embodiments thereof.

Figure 1:
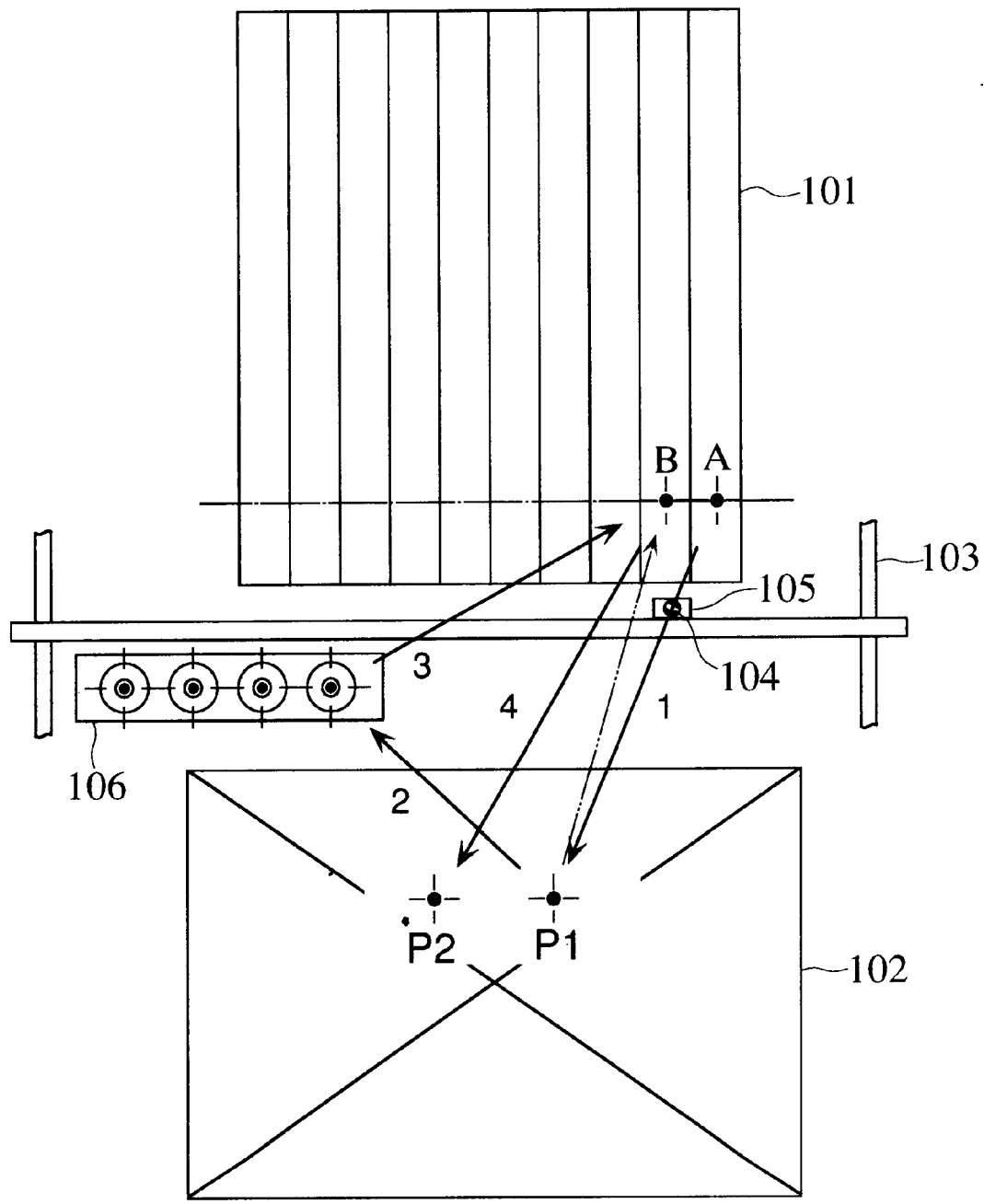
FIG. 1 is a diagram schematically illustrating operations of a conventional electronic component-mounting apparatus for mounting electronic components.
Figure 2:
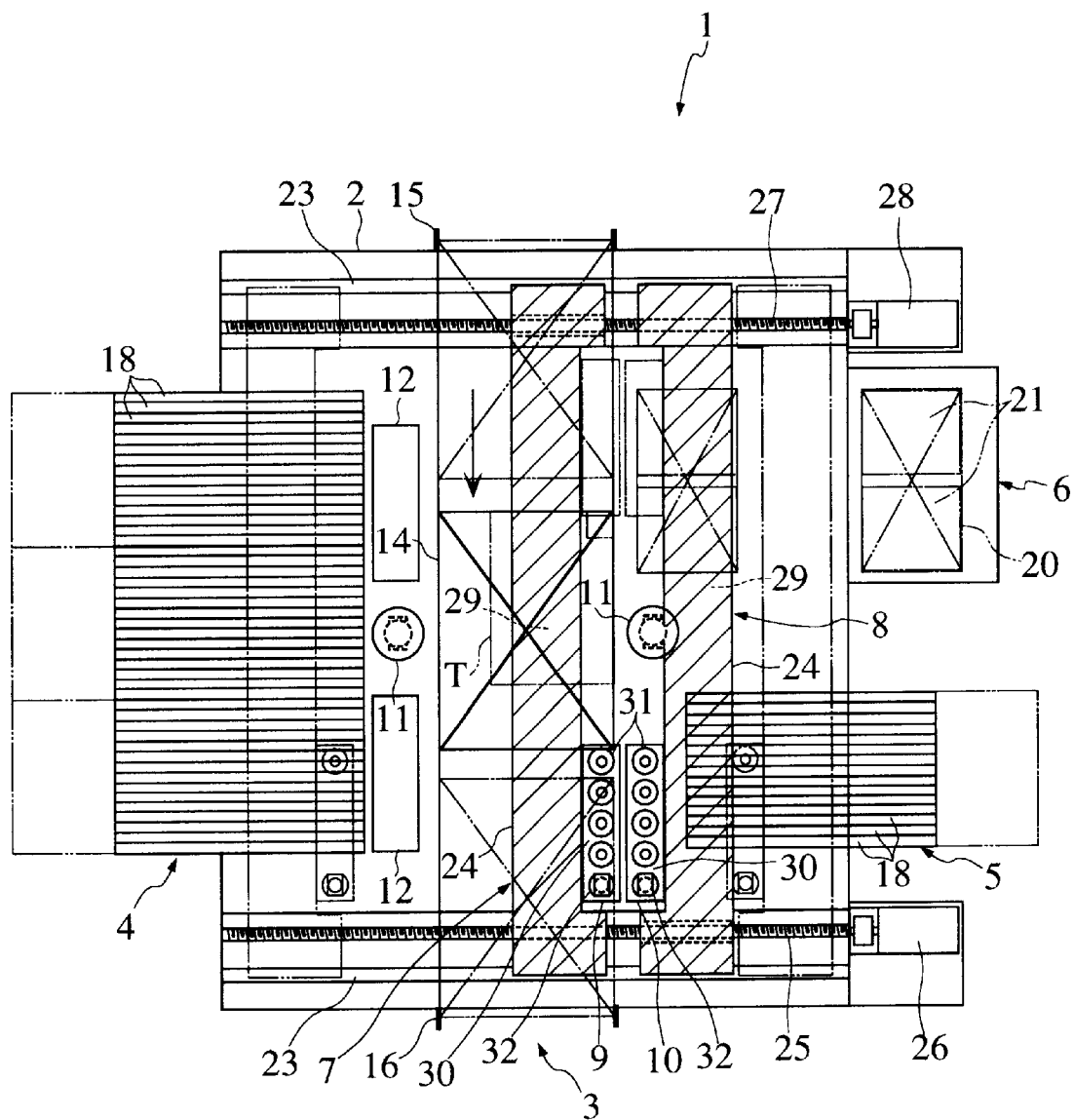
FIG. 2 is a plan view of an electronic component-mounting apparatus according to a first embodiment of the invention.

Referring first to FIG. 1, there is shown an electronic component-mounting apparatus according to a first embodiment of the invention, which is a so-called multi-function chip mounter used for mounting various kinds of electronic components, such as surface-mounting components including chip capacitors, chip resistances, etc., and multilead components of flat package ICs. The electronic component-mounting apparatus 1 is comprised of a base 2, a conveyor 3 extending transversely on a central area of the base 2, a first electronic component-feeding block 4 provided on a left-hand end of the base 2 as viewed in FIG. 2, second and third electronic component-feeding blocks 5, 6, arranged side by side on a right-hand end of the base 2 as viewed in the same, and first and second X-Y stages 7, 8 arranged at respective left and right portions of the base 2. The first X-Y stage 7 has a first head unit 9 installed thereon, and similarly, the second X-Y stage 8 has a second head unit 9 installed thereon, for sucking and mounting electronic components S. Further, component-sensing cameras 11, 11 are also arranged at locations on respective longitudinally opposite sides, i.e. on a left side and a right side, of the conveyor 3, while nozzle storage devices 12, 12 are arranged at locations on respective transversely-opposite sides of the component-sensing camera 11 on the left side of the conveyor 3. The component-sensing cameras 11, 11 on the left and right sides of the conveyor 3 respectively correspond to the first and second head units 9, 10, and sense or recognize electronic components S sucked by these head units 9, 10, to thereby determine whether they are sucked as well as correct the angles of the electronic components relative to a horizontal plane before they are mounted on the circuit board.

Further, each nozzle storage device 12 holds various kinds of sucking nozzles 41, referred to hereinafter, in stock, to supply sucking nozzles for replacing sucking nozzles 41 mounted on the head units 9 and 10 therewith e.g. when the kind of a circuit board T is changed. The two nozzle storage devices 12, 12 may be arranged in axial symmetry with respect to the conveyor 3 or in point symmetry with the center of the same. In such a case, replacement of mounted sucking nozzles 41 by stored sucking nozzles can be simultaneously carried out for the first and second head units 9, 10.

This electronic component-mounting apparatus 1 is supplied with electronic components S, which are small in size, such as surface-mounting components, at the first and second component-feeding blocks 4, 5, and electronic components S, which are large in size, such as multilead components, at the third component-feeding block 6. Circuit boards T are supplied from the rear side (the upper side as viewed in FIG. 2) and delivered forward (downward as viewed in the FIG. 2). For example, when the first X-Y stage 7 is operated to mount an electronic component S, the first head unit 9 thereon is brought to a selected one of the first, second, and third component-feeding blocks 4, 5, 6, from which a predetermined electronic component S is sucked thereat, and then the first head unit 9 is moved to a predetermined location above the circuit board T, from which the electronic component S is mounted on the circuit board T. The first X-Y stage 7 and the second X-Y stage 8 are alternately operated as circuit boards T are supplied one after another.

The conveyor 3 includes a table 14 located in the center, a supply passage 15 located on the rear side, and a delivery passage 16 located on the front side. Each circuit board T is supplied to the table 14 from the rear side, and set at a predetermined level on the table 14 to have electronic components mounted thereon. The circuit board T having the electronic components S mounted thereon is delivered forward by way of the supply passage 6. During this process, a new circuit board T to be supplied, not shown, is on standby in the supply passage 15, and the immediately preceding one having the electronic components mounted thereon, not shown, is on standby for delivery in the delivery passage 16. Thus, the circuit boards T are conveyed forward, one after another.

On the first and second component-feeding blocks 4, 5, there are arranged a lot of tape cassettes 18 in parallel with each other. Each tape cassette 18 contains a carrier tape, not shown, which carries thereon a large number of electronic components S of the same kind at equally-spaced intervals. The electronic components S are fed at a predetermined pitch, i.e. with predetermined space intervals, from a forward end of each of component-feeding blocks 4, 5, one by one. In other words, the electronic components S are supplied from the tape cassettes 18 in an aligned manner at intervals of an identical distance along a row of the tape cassettes. The third component-feeding block 6 has a large number of shelves 20, and two trays 21 placed on each of the shelves. Electronic components S are contained in each tray 21 in a state aligned with each other. In the case of the third component-feeding block 6, the trays 21 on the shelves 20 are moved by a transport device, not shown, whereby the electronic components S are moved to positions close to the conveyor 3, from which the mounting head sucks each of them.

The first and second X-Y stages 7, 8 have respective X-direction movable tables 24, 24, each guided along a pair of guide rails 23, 23 extending longitudinally (in the X-axis direction) on the forward and backward ends of the base 2. The X-direction movable table 24 of the first X-Y stage 7 is fitted on a ball screw 25 on the forward side, and an electric motor 26 connected to the ball screw 25 operates to rotate the ball screw 25 in a normal or reverse direction to thereby move the X-direction movable table 24 in the X-axis direction (in the longitudinal direction). Similarly, the X-direction movable table 24 of the second X-Y stage 8 is fitted on a ball screw 27 on the rear side, and an electric motor 28 connected to the ball screw 27 operates to rotate the ball screw 27 in a normal or reverse direction to thereby move the X-direction movable table 24 in the X-axis direction.

The two X-direction movable tables 24, 24 have an identical construction, and each of them contains a Y-direction movable unit 29. The Y-direction movable unit 29 of the first X-Y stage 7 has the head unit 9 installed thereon, and the Y-direction movable unit 29 of the second X-Y stage 8 has the head unit 10 installed thereon, whereby as the Y-direction movable unit 29 operates, a corresponding one of the head units 9, 10 is moved in the Y-axis direction (in the transverse direction). Thus, the head units 9, 10 are movable both in the X-axis direction and the Y-axis direction, i.e. on the horizontal plane. The Y-direction movable unit 29 may be embodied by a screw mechanism using a ball screw or the like and an electric motor associated therewith for rotating the same, or by a linear motor. Similarly, the X-direction movable table 24 may be moved by a linear motor.

The head units 9, 10 each include a support frame 30 mounted on the Y-direction movable unit 29, four mounting heads 31, 31, 31, 31 mounted on the support frame 30, and one circuit board-sensing camera 32. The mounting heads 31, 31, 31, 31 and the circuit board-sensing camera 32 are collectively mounted on the support frame 30 at transversely equally-spaced intervals. The circuit board-sensing camera 32 senses a reference mark on the circuit board T, and a position of the reference mark on the circuit board T serves as a reference position with reference to which each electronic component is mounted on the circuit board T. The circuit board-sensing camera 32 may be used to sense the position of an electronic component S to be sucked from the tape cassette 18.

Figure 3:
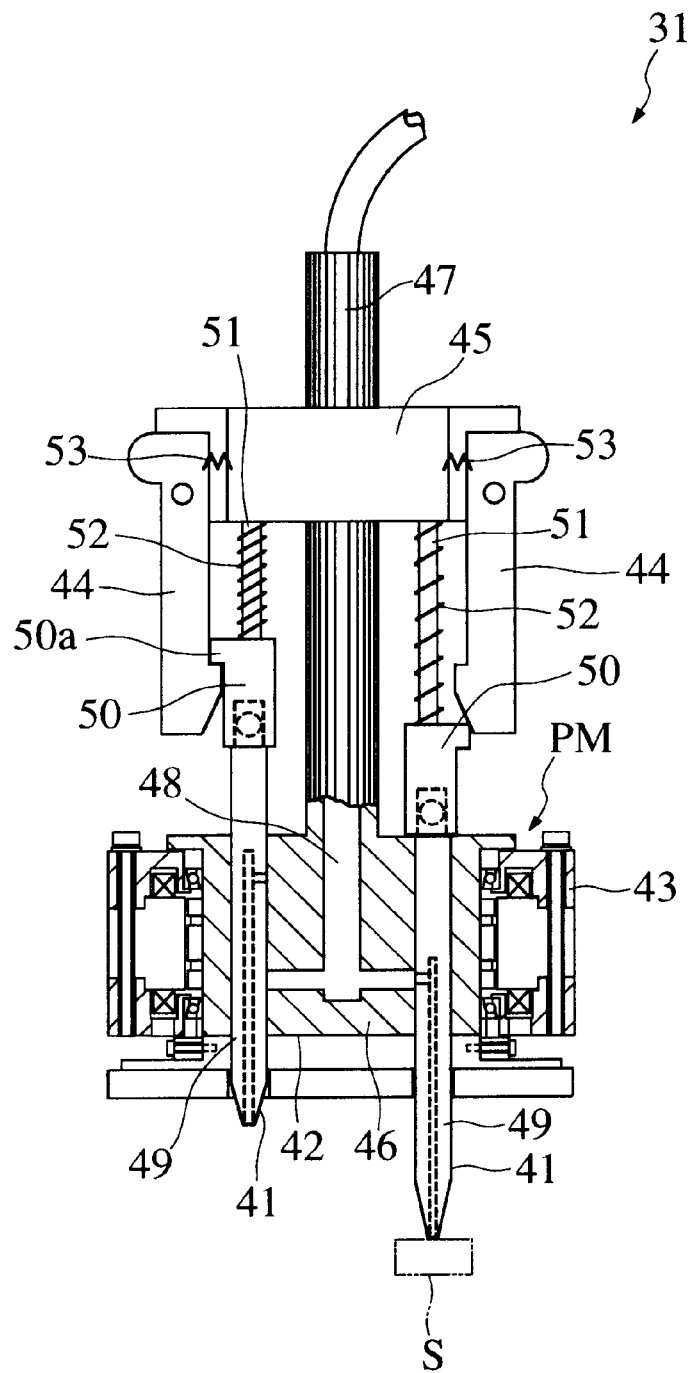
FIG. 3 is a partly sectional plan view of a mounting head according to the first embodiment of the invention.

Each mounting head 31 is, as shown in FIG. 3, comprised of five sucking nozzles 41 (only two of them are shown in the figure), a nozzle holder 42 having the sucking nozzles 41 mounted thereon along the circumference at equally-spaced intervals such that each of the sucking nozzles 41 can be projected downward and retracted upward, a housing 43 enclosing the nozzle holder 42, five engaging hooks 44 for engagement with the sucking nozzles 41, respectively, and a hook holder 45 holding the five engaging hooks 44. The nozzle holder 42 is comprised of a holder body 46, and a spline shaft 47 extending upward from the holder body 46, with a vacuum passage 48 which is formed through a central portion extending along the vertical axis of the holder body 46 and the spline shaft 47 and connected to a vacuum device, not shown. The vacuum passage 48 has branched end portions with which only a projected one of the sucking nozzles 41 is communicated.

On the other hand, arranged between the nozzle holder 42 and the housing 43 is a stepping motor PM which incorporates the nozzle holder 42 as a rotor and the housing 43 as a stator. Therefore, the nozzle holder 42 indexes in predetermined angular increments according to the number of steps of a pulse signal supplied to the stepping motor PM. This makes it possible to bring a projected one of the sucking nozzles 41 or one selected for projection to a predetermined position by rotation of the nozzle holder 42.

In place of the stepping motor PM, there may be used a servo motor which carries sucking nozzles 41 on the rotor thereof such that each of the sucking nozzles 41 can be lifted upward or lowered downward i.e. vertically moved.

As described above, the sucking nozzles 41 are arranged in the nozzle holder 42 which serves as the rotor, and therefore the sucking nozzles 41 can be rotated more accurately with less backlash through degrees of an angle instructed to the stepping motor PM than in the case of the spline shaft 47 being rotated by way of a belt by an electric motor arranged on a location of each of the head units 9, 10 other than a location of the stepping motor PM. Further, the above construction of the nozzle holder 42 as the rotor is advantageous in that the head units 9, 10 can be constructed without increasing the weight thereof, and designed in compact. This advantage is more marked as the number of heads 31 mounted on the head units 9, 10 is increased.

Each sucking nozzle 41 is comprised of a nozzle body 49, and a hook catch 50 arranged on an upper end of the nozzle body 49. The nozzle body 49 is removably mounted on the hook catch 50. A guide rod 51 extends from the hook holder 45 through the hook catch 50, and has a coiled spring wound around the same. The sucking nozzle 41 is urged downward or in a projecting direction by the coiled spring 52. The guide rod 51 is fixed to the holder body 46, and at the same time inserted into a hole, not shown, formed through the hook holder 45, whereby as the holder body 46 moves upward and downward, the guide rod 51 slides in the hole. The hook catch 50 has an engaging portion 50a formed at an upper end thereof in a manner protruded radially outward, for engagement with or disengagement from the engaging hook 44. The engaging hook 44 is pivotally mounted on the hook holder 45, and at the same time urged in an engaging direction by a spring 53 interposed between the hook holder 45 and itself.

Therefore, as the sucking nozzle 41 is moved upward against the urging force of the coiled spring 52, the engaging hook 44 is brought into engagement with the hook catch 50 by the urging force of the spring 53, whereby the sucking nozzle 41 is lifted into a retracted position. From this state, when the engaging hook 44 is pivotally moved outward to be disengaged from the hook catch 50, the sucking nozzle is moved downward by the urging force of the coiled spring 52 into a position projected from the nozzle holder 42. The hook holder 45 and the spline shaft 47 of the nozzle holder 42 are in spline engagement with each other, whereby as the hook holder 42 rotates, the spline shaft 47 rotates in an axially slidable manner.

Now, referring to FIGS. 4A to 4C, the selective replacement of the five sucking nozzles 41 on the mounting head 31 will be described. This replacement is effected by retracting a projected one of the sucking nozzles 41 and at the same time projecting a newly-selected one of them to be projected. As shown in the figure, an actuator unit 33 is arranged on the support frame 30 in a manner associated with a corresponding one of the mounting heads 31, and a stopper arm 34 extends from a portion of the support frame 30 located above the actuator unit 33. The mounting head 31 has its housing 43 fixed to a support block 35 of the actuator unit 33, and its hook holder 45 abut on the arm 34 from below whereby the mounting head is restricted in respect of an upward movement. The stopper arm has forked end portions between which a roller 34a is arranged. That is, the stopper arm 34 abuts on the hook holder 45, in a manner preventing the hook holder 45 from moving upward and permitting the same to rotate thereon.

The actuator unit 33 contains a linear motor, no shown, and the mounting head 31 is moved upward and downward (in a Z-axis direction) by the actuator unit 33. Further, from the support block 35 extends upward a disengaging member 36 for causing the engaging hook 44 to be pivotally moved away (disengaged) from the hook catch 50. As the actuator unit 33 moves upward and downward, the nozzle holder 42 moves upward and downward relative to the hook holder 45 which is prevented by the stopper arm 34 from moving upward. That is, the mounting head 31, the actuator unit 33, the stopper arm 34, and the disengaging member 36 form the mounting head device. Further, the actuator unit 33, the stopper arm 34 and the disengaging member 36 form a nozzle-replacing device of the invention.

FIGS. 4A to 4C show the process of causing a projected sucking nozzle 41 on the left-hand side as viewed in each of the figures to be retracted upward and causing a retracted one on the right-hand side as viewed in the same to be projected downward. More specifically, from a state of the mounting head where the left-hand sucking nozzle 41 has been selected for use (projected downward), with the remaining four sucking nozzles retracted, the left-hand sucking nozzle 41 is retracted and one of the remaining four sucking nozzles 41 to be selected for use (the right-hand sucking nozzle 41) is projected.

First, as shown in FIG. 4A, the nozzle holder 2 and the hook holder 45 are rotated to a position where the sucking nozzle 41 to be selected and an engaging hook 44 corresponding thereto are opposed to the disengaging member 36. Then, the actuator unit 33 is driven to move upward, thereby bringing the nozzle holder 42 toward the hook holder 45. The engaging portion 50a at the upper end of the left-hand sucking nozzle 41 abuts and pushes the engaging hook 44 on the hook holder 45 on the left-hand side in FIG. 4A, whereby this engaging hook 44 is once pivotally moved outward or in a clockwise direction to permit upward movement of the engaging portion 50a until the engaging hook 44 is relatively moved over the engaging potion 50a and pivotally moved in a counter-clockwise direction to be engaged with the hook catch 50, whereupon the actuator unit 33 is stopped. In this state, only the engaging hook 44 corresponding to the sucking nozzle 41 selected for use is moved away from the hook catch 50 by the disengaging member 36 (see FIG. 4B). Then, the actuator unit 33 is moved downward to move the nozzle holder 42 in a direction away from the hook holder 45. During this process, the sucking nozzle 41 selected for use moves downward without being engaged with the engaging hook 44 and the other sucking nozzles 41 are engaged with the engaging hooks 44 corresponding thereto and prevented from moving downward. In short, only the right-hand sucking nozzle 41 as shown in the figure is brought to a projected position by the urging force of the coiled spring 52 (see FIG. 4C).

In this way, the mounting head 31, the actuator 33, and the stopper arm 34, and the disengaging member 36 cooperate to selectively replace sucking nozzles 41, whereby it is possible to replace or change sucking nozzles 41 even during travel of the head units 9, 10. Although in the present embodiment, one mounting head 31 carries five sucking nozzles 41, this is not limitative, but so long as the head units 9, 10 each carry a plurality of mounting heads 31, the mounting head 31 may carry a single sucking nozzle. Further, so long as one mounting head 31 carries a plurality of sucking nozzles 41, each of the head units 9, 10 may has a single mounting head installed thereon.

Although not shown in the figures, the spline shaft 47 of the nozzle holder 42 is provided with a stopper, whereby the nozzle holder 42 is not permitted to move further upward relative to the hook holder from the states shown in FIGS. 4A and 4C. The position of the mounting head 31 shown in FIGS. 4A to 4C is one for selecting (replacing) sucking nozzles 41, but when an electronic component S is sucked or mounted, the whole mounting head 31 is moved further downward. That is, each mounting head 31 replaces (selects) sucking nozzles 41 at a level higher than the reference level L at which the mounting head 31 having sucked an electronic component S is moved by the X-Y stage 7 or 8 to a mounting position where it is mounted on the circuit board T.

Therefore, each engaging hook 44 cannot be brought into contact with the disengaging member 36 by an operation other than the above-described nozzle-replacing operation in which a sucking nozzle 41 corresponding thereto is selected for use, and further, the position of the engaging hook 44 is not adversely affected by rotation of the nozzle holder 42 about its vertical axis for positioning or correcting angular position of the electronic component S sucked by the sucking nozzle 41.

Figures 5A, 5B:
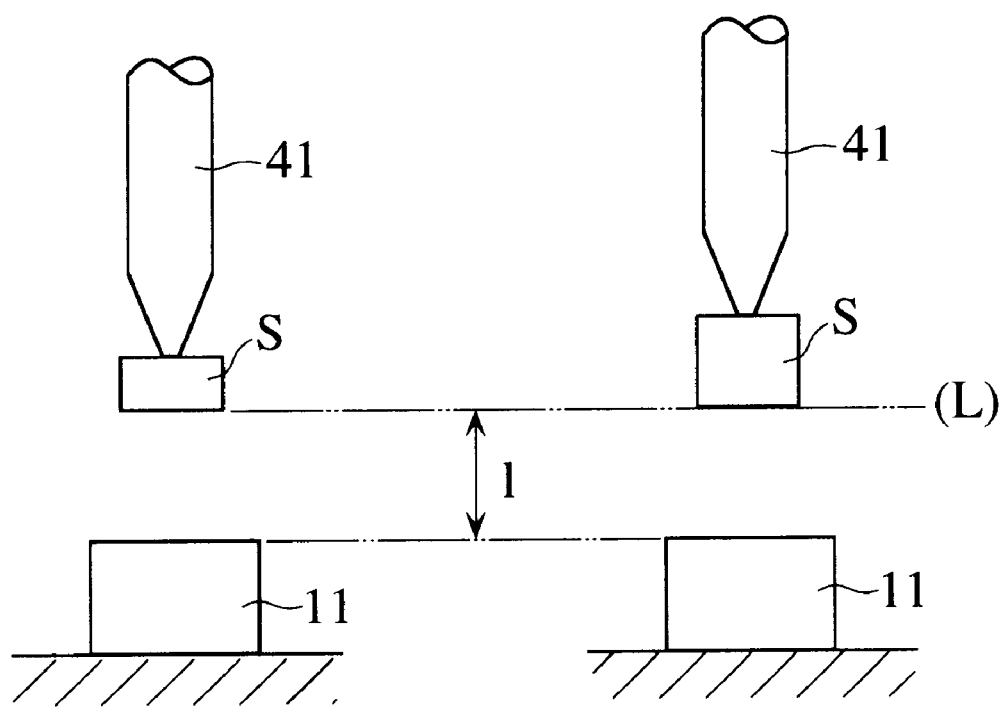
FIGS. 5A and 5B are side elevations of a sucking nozzle and an electronic component sucked thereat which are useful in explaining a reference level of the electronic component.

The reference level L is defined as a level in which the bottom surface of each electronic component S is above the component-sensing camera by a distance 1, as shown in FIGS. 5A and 5B. That is, even if electronic components S are different in thickness, each electronic component S sucked by the sucking nozzle is moved upward until the bottom surface thereof reaches the reference level L, and then moved by the X-Y stage 7 or 8. This ensures that the bottom surface of the electronic component S is always set to a constant level, thereby dispensing with the need for adjusting the depth of focus of the component-sensing camera 11 and enabling the same to recognize the electronic component S with a clear image. Further, the top surface of the circuit board T is set to a level higher than the position of the component-sensing camera 11 by the distance 1, so that in the examples illustrated in FIGS. 5A and 5B, the bottom surface of each electronic component S sucked by the sucking nozzle 41 is recognized at the same level at which the electronic component S is mounted in the circuit board S, thereby preventing the position of the electronic component S from being deviated horizontally from its proper position when it is mounted on the circuit board T due to a difference between a level of the sucking nozzle 41 assumed when the electronic component S is recognized by the component-sensing camera 11 and a level of the same assumed when the electronic component S is mounted.

Further, after recognition of the electronic component S by the component-sensing camera 11, the sucking nozzle 41 is lifted by the actuator unit 33 to a level high enough to avoid interference with a structure (e.g. members for fixing the circuit board T or the like) of the electronic component-mounting apparatus and electronic components S already mounted on the circuit board T, and lowered when it is brought to a horizontal position where the sucked electronic component S is to be mounted. The mounting heads 31 each have its level adjusted by the actuator unit 33 provided therefor. Therefore, the electronic component S sucked by a sucking nozzle 41 of any of the mounting heads 31 does not strike against the electronic components already mounted on the circuit board T or the like, and the level of each mounting head can be set to a level as low as possible within a range of free of the interference. This makes it possible to reduce the lowering stroke of the mounting head 31 and hence shorten a time period required for mounting each electronic component S on the circuit board T.

Now, the basic operation of the electronic component-mounting apparatus 1 will be described with reference to FIG. 6, which shows a case where the electronic component S is picked up from the second component-feeding block 5 and mounted on the circuit board T. In this case, the CPU, not shown in the figure, is supplied with data of a position of each tape cassette 18, kinds of electronic components S stored in the tape cassette 18, a position of the circuit board T, various kinds of electronic components S to be mounted on the circuit board T and positions therefor (including angular positions). According to instructions delivered from the CPU, the operations of the X-Y stages 7, 8, the operation of each actuator unit 33, the rotation of each nozzle holder 42 (stepping motor PM), etc. are controlled. In the following, description of the recognition of the electronic component S by the component-sensing camera 11 is omitted. Further, in FIG. 6, only one mounting head 31 and only one sucking nozzle 41 thereof are shown, but the other mounting heads 31 and sucking nozzles 41 are omitted.

Figure 6:
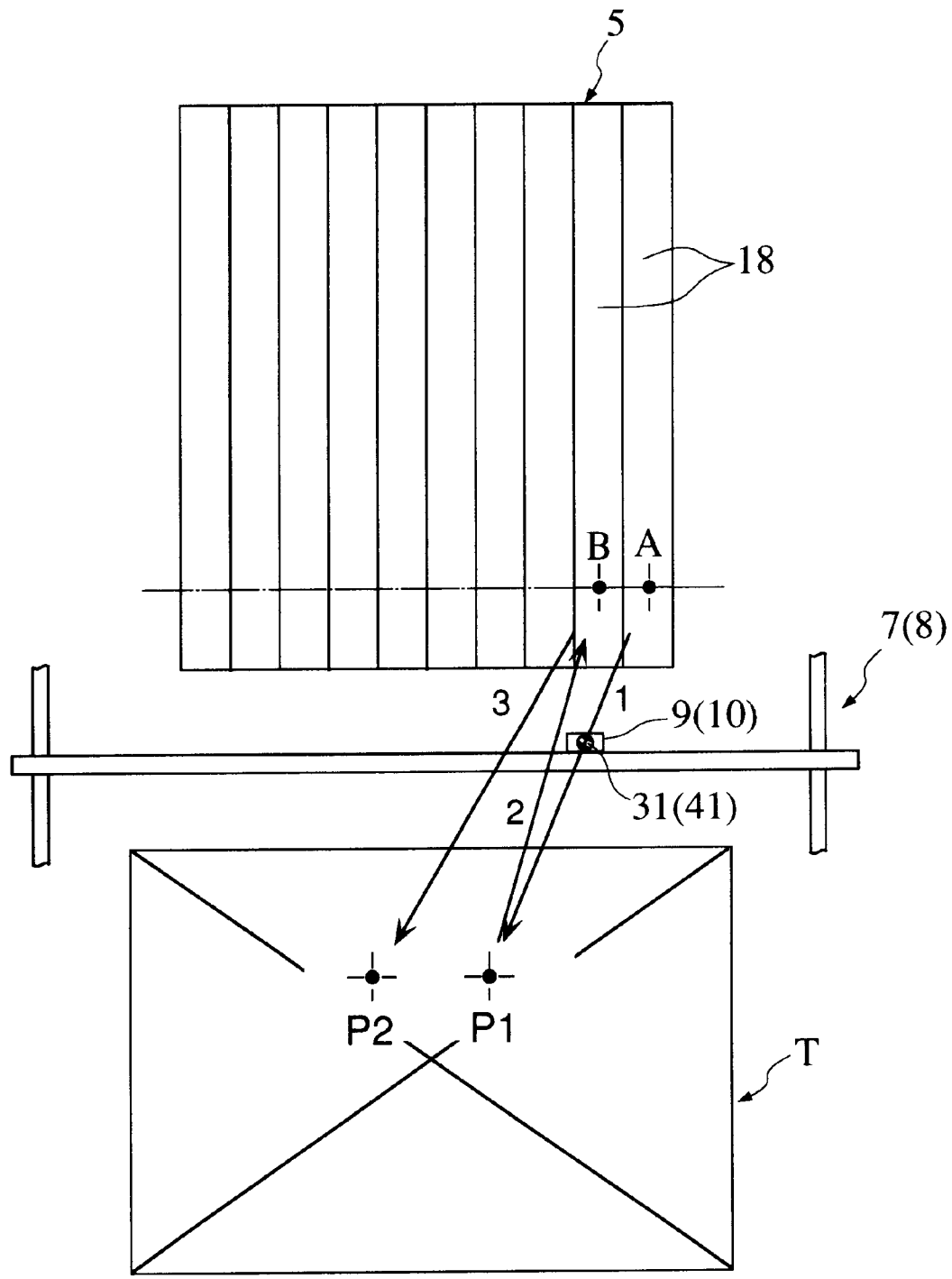
FIG. 6 is a diagram schematically illustrating operations of the electronic component-mounting apparatus according to the first embodiment for mounting electronic components.

In the example shown in FIG. 6, an electronic component S sucked at a point A of the second component-feeding block 5 is mounted at a point P1 of a circuit board T set on the table 14. Then, an electronic component S sucked at a point B of the second component-feeding block 5 is mounted at a point P2 of the circuit board T. In this procedure, first, a selected one of the X-Y stages 7 and 8 moves the mounting head 31 from its home position to a position exactly above the point A, and then the actuator 33 lowers the mounting head 31 to suck the electronic component S at the point A. After sucking the electronic component S, the actuator unit 33 lifts the mounting head 31 (to the reference level L), and then the X-Y stage 7 or 8 moves the mounting head 31 from the point A to a position exactly above the point P1. During the process, the nozzle holder 42 (stepping motor PM) is rotated to bring the electronic component S to a predetermined angular position for mounting. Then, the mounting head 31 is lowered again to mount the electronic component S at the point P1.

Then, the mounting head 31 is moved to the point B to suck another electronic component S, and then the electronic component sucked at the point B is mounted at the point P2 on the circuit board T. In doing this, when the electronic component S supplied at the point B can be handled by the same sucking nozzle 41, the electronic component S is mounted in the same manner as described above. However, if the electronic component S supplied at the point B cannot be handled by the same sucking nozzle 41, during the travel of the mounting head from the point P1 to the point B, the nozzle holder 42 of the mounting head 31 is rotated to select a sucking nozzle 41 (replace one in use by a newly selected one). When the mounting head 31 is moved to the point B, the new sucking nozzle 41 is operated to suck the electronic component, and then the mounting head 31 is moved to the point P2 while adjusting the angular position of the electronic component S by slight rotation as described above to mount the same on the circuit board T.

The above sucking and mounting operations are carried out by the four mounting heads 31 such that electronic components S are successively sucked at any of the component-feeding blocks 4, 5, 6, (simultaneously if predetermined sucking conditions are satisfied), and then the head unit 9 or 10 is moved to the circuit board T to successively mount the sucked electronic components on the circuit board T, one after another. In doing this, to enable as many mounting heads 31 as possible (preferably all mounting heads 31) on the head unit 9 or 10 to suck electronic components S, replacement of sucking nozzles 31 within each mounting head 31 is carried out by rotation of the stepping motor PM (details of the operation will be described hereinafter) during travel of the head unit 9 or 10 made after the sucked electronic components are mounted and before new electronic components are sucked.

If sucking nozzles 41 on a plurality of mounting units 31 are replaced by moving the head unit 9 or 10 which has the mounting heads 31 installed thereon and travels in the X-Y direction to the nozzle storage device 12, the mounting heads 31 which do not require replacement or exchange of sucking nozzles 41 are also moved to the nozzle storage device, since all the sucking nozzles 41 are not necessarily required to be replaced at the same time, which degrades the efficiency of operation of the electronic component-mounting apparatus (particularly when only one mounting head 31 requires replacement of sucking nozzles thereof). On the other hand, if the replacement of sucking nozzles 41 is not carried out, it is not possible to take advantage of provision of the plurality of mounting heads 31 on each head unit 9 or 10 (particularly when the number of mounting heads 31 requiring nozzle replacement is large). However, according to the present embodiment, if a plurality of sucking nozzles 41 are installed on each of the mounting heads 31 within each single unit of the head units 9, 10, and the plurality of sucking nozzles 41 are constructed to be replaceable for use during travel of the head units 9, 10, the nozzle storage device 12 is less often used, and electronic components S can be sucked by the use of all mounting heads 31 provided on the head units 9, 10.

Further, the combination of kinds of sucking nozzles 41 carried by the mounting heads 31 within the head units 9, 10 can be determined as desired. For example, all the mounting heads 31 may carry an identical combination of sucking nozzles 41, or respective different combinations of sucking nozzles 41. To make as many kinds of sucking nozzles 41 replaceable during travel of the head units 9, 10 to thereby suck as many kinds of electronic components S as possible, it is only required that different kinds of sucking nozzles 41 are provided on the different kinds of mounting heads 31. Further, if a lot of electronic components S which can be sucked by identical sucking nozzles 41 are to be mounted on a circuit board T, at least one such a sucking nozzle 41 may be arranged on each of as many mounting heads of the same head unit 9 or 10, whereby many of the electronic components S can be sucked by one travel of the head unit 9 or 10, and occurrence of one or more unavailable mounting heads 31 can be made less frequent. In such a case, by providing tape cassettes 18 supplying the electronic components S which can be sucked by the identical sucking nozzles 31, in the same number as the number of mounting heads 31 carrying the identical sucking nozzles 41, it is possible to suck the electronic components S simultaneously, or at least reduce the distance of travel of the head unit 9 or 10 by successively sucking the electronic components S.

Next, the correction of position of the mounting head 31 (or sucking nozzles 41) for sucking electronic components S will be described with reference to FIGS. 7A to 8C. For example, at the tape cassette 18, an electronic component held in a recess of the carrier tape is sucked. The CPU carries out control such that the sucking nozzle 41 is brought to a position facing the center of the recess. Therefore, a slight error in operation of feeding the carrier tape, improper position of an electronic component S within the recess, a shape of the electronic component S difficult to handle, etc. can cause failure of sucking the electronic component S. To eliminate this inconvenience, in the present embodiment, it is made possible to correct the position of each sucking nozzle 41 in which the electronic component S is sucked. Although the recognition of the position of the electronic component S to be sucked is carried out based on results of recognition by the component-sensing camera 11 supplied in a feedback manner, this is not limitative, but it may be carried out by the circuit board-sensing camera 32 installed on the support frame 30.

Figures 7A, 7B, 7C:
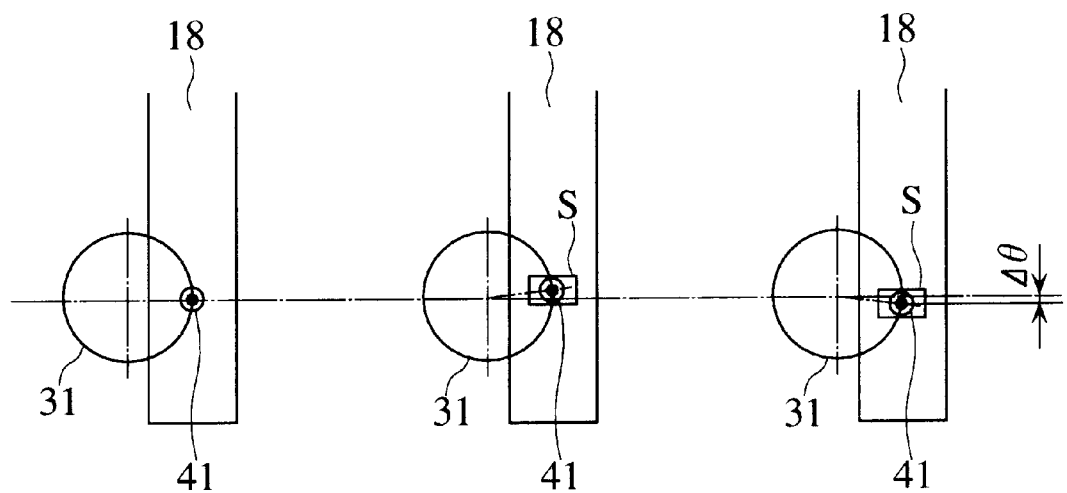
FIGS. 7A to 7C are plan views illustrating manners of correcting longitudinal positions of a sucking nozzle relative to an electronic component.

FIGS. 7A to 7C show cases where the electronic component S is liable to deviate from its proper position along the longitudinal axis of the tape cassette 18 due to the shape thereof. That is, when the size of the electronic component along the feeding direction (i.e. along the longitudinal axis of the tape cassette 18) is short, it is necessary to accurately correct the position of the sucking nozzle 41 in this direction since the deviation of the sucking nozzle in this direction tends to cause failure of sucking the electronic component S. As shown in FIG. 7B, if the electronic component S deviates backward from its proper position (shown in FIG. 7A), the mounting head 31 (i.e. the nozzle holder 42) is slightly rotated counterclockwise from the position shown in FIG. 7A to thereby correct the position of the sucking nozzle 41. If the electronic component S deviates forward from its proper position as shown in FIG. 7C, the mounting head 31 is slightly rotated clockwise from the position shown in FIG. 7A to thereby correct the position of the sucking nozzle 41.

If the head unit 9 or 10 has only one mounting head 31 installed thereon, the above correcting operation is not particularly required, since the correction of the position of the sucking nozzle 41 can be effected by merely moving the X-Y stage 7 or 8. However, if the head unit 9 or 10 carries a plurality of mounting heads 31, the above correction is very useful, since cases are increased where it is possible to suck a plurality of electronic components simultaneously.

Figure 8A:
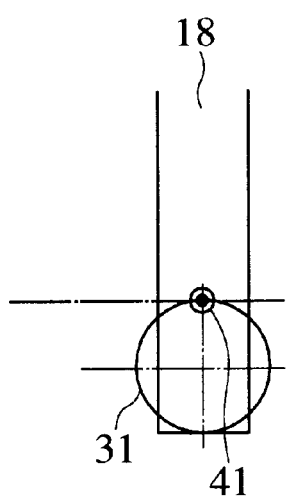
FIGS. 8A to 8C are plan views illustrating manners of correcting transverse positions of a sucking nozzle relative to an electronic component.
Figure 8B:
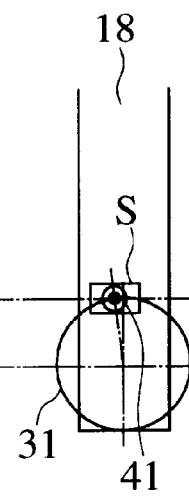
Figure 8C:
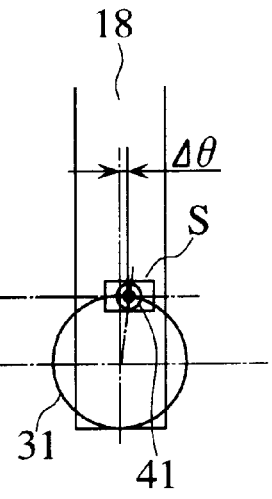

Similarly, FIGS. 8A to 8C show cases where the electronic component S is liable to deviate from its proper position transversely with respect to the longitudinal axis of the tape cassette 18 due to the shape thereof. As shown in FIG. 8B, if the electronic component S deviates leftward as viewed in the figure from its proper position (shown in FIG. 8A), the mounting head 31 (i.e. the nozzle holder 42) is slightly rotated counterclockwise from the position shown in FIG. 8A to thereby correct the position of the sucking nozzle 41. If the electronic component S deviates rightward as viewed in the figure from its proper position as shown in FIG. 8C, the mounting head 31 is slightly rotated clockwise from the position shown in FIG. 8A to thereby correct the position of the sucking nozzle 41.

It should be noted that even if the mounting head 31 carries only one sucking nozzle 41, so long as the sucking nozzle 41 is arranged at a location remote form the center of rotation of the mounting head 31 (rotational position about the axis of the mounting head 31), the above correction can be effected.

Thus, according to the present embodiment, the mounting head 31 is rotated by the stepping motor PM incorporated in the mounting head 31 to correct the position of the sucking nozzle 41. Therefore, the electronic component S can be sucked by a central portion thereof, which minimizes the possibility of failure of sucking of the electronic component S.

Next, referring to FIGS. 9A to 9D, special methods of sucking electronic components S by the electronic component-mounting apparatus according to the present embodiment will be descried. As described above, each X-Y stage carries four mounting heads 31 thereon. Therefore, it is possible to simultaneously suck a plurality of electronic components S from the component-feeding block 4, 5 or 6 by using the plurality of mounting heads 31. Further, even if the electronic components S are not sucked simultaneously, all the mounting heads may be successively caused to suck an electronic component at the component-feeding block 4, 5 or 6, and thereafter brought to the circuit board T.

FIGS. 9A to 9D show cases where two of the mounting heads 31, 31 are used to simultaneously suck electronic components S at the second component-feeding block 5 (or the first component-feeding block 4). The tape cassettes 18 on the second component-feeding block 5 are all constructed to have an identical width, and arranged side by side immediately close to each other. On the other hand, the mounting heads 31 are arranged at a pitch (distance d2 between the mounting heads) twice as large as a pitch of the tape cassettes (distance d1 between the tape cassettes). Further, the diameter of a circular path of rotation of the sucking nozzles 31 is equal to the pitch (distance d1) at which the tape cassettes 18 are arranged.

Therefore, when the sucking nozzles 41, 41 of the two mounting heads 31, 31 adjacent to each other are rotated such that they are closest to each other, the distance between the sucking nozzles 41, 41 becomes equal to the distance d1, and therefore it is possible to simultaneously suck electronic components S by the use of the mounting heads 31, 31 adjacent to each other (see FIGS. 9A and 9B). Further, when the sucking nozzles 41, 41 of the mounting heads 31, 31 adjacent to each other are rotated to respective left-hand or right-hand positions with respect to a row of the tape cassettes 18, the distance between the two sucking nozzles 41, 41 become equal to the distance d2 (2×d1), and therefore it is possible to suck electronic components S from respective tape cassettes 18, 18 on opposite sides of one tape cassette 18 (see FIGS. 9A and 9C). Further, by rotating the sucking nozzles 41, 41 of the mounting heads 31, 31 adjacent to each other such that they become most distant from each other, the distance between the sucking nozzles 41, 41 becomes equal to a distance d3 (=3×d1), and therefore it is possible to suck electronic components S from two tape cassettes 18, 18 at respective locations spaced by two tape cassettes (see FIGS. 9A and 9C).

Even if the diameter of a circular path of rotation of the sucking nozzles about the axis of each mounting head 31 is not equal to the distance of the pitch of arrangement of the tape cassettes 18 (distance d1), so long as the diameter of a circular path of rotation of sucking nozzles 41 about the axis of the mounting head is larger than the pitch (distance d1), it is possible to rotate selected sucking nozzles 41 of mounting heads 31 to respective positions where they can suck electronic components simultaneously from tape cassettes 18.

Thus, it is possible not only to simply suck electronic components S simultaneously by the use of a plurality of mounting heads 31, but also to select tape cassettes 18 from which electronic components S are sucked by rotating the sucking nozzles 41 about the vertical axis of each mounting head 31 and thereby changing positions of the sucking nozzles 41 in a suitable manner. Therefore, although it is not always possible to mount electronic components S by sucking them simultaneously, simultaneous sucking of electronic components can be carried out more often by selecting the electronic components to be simultaneous sucked. The increased frequency of simultaneous sucking is particularly useful for a divisible circuit board having a plurality of identical circuit boards arranged side by side.

Next, referring to FIGS. 10A to 10D, a variation of the present embodiment using another method of simultaneous sucking of electronic components will be described. In this variation, two sucking nozzles 41, 41 positioned along the circumference of each mounting head 31 are used to suck electronic components S from the four tape cassettes 18, 18, 18, 18. In this case, although not particularly shown, a pair of disengaging members 36 are provided on each mounting head 31, and one of them is constructed such that it can move to or back from an engaging hook 44 corresponding thereto and the other is constructed as described hereinabove. Further, the vacuum passage 48 is formed such that it is communicated with the two sucking nozzles projected simultaneously. That is, the mounting head with the two sucking nozzles 41, 41 projected out is used to suck electronic components S simultaneously.

Figure 10:
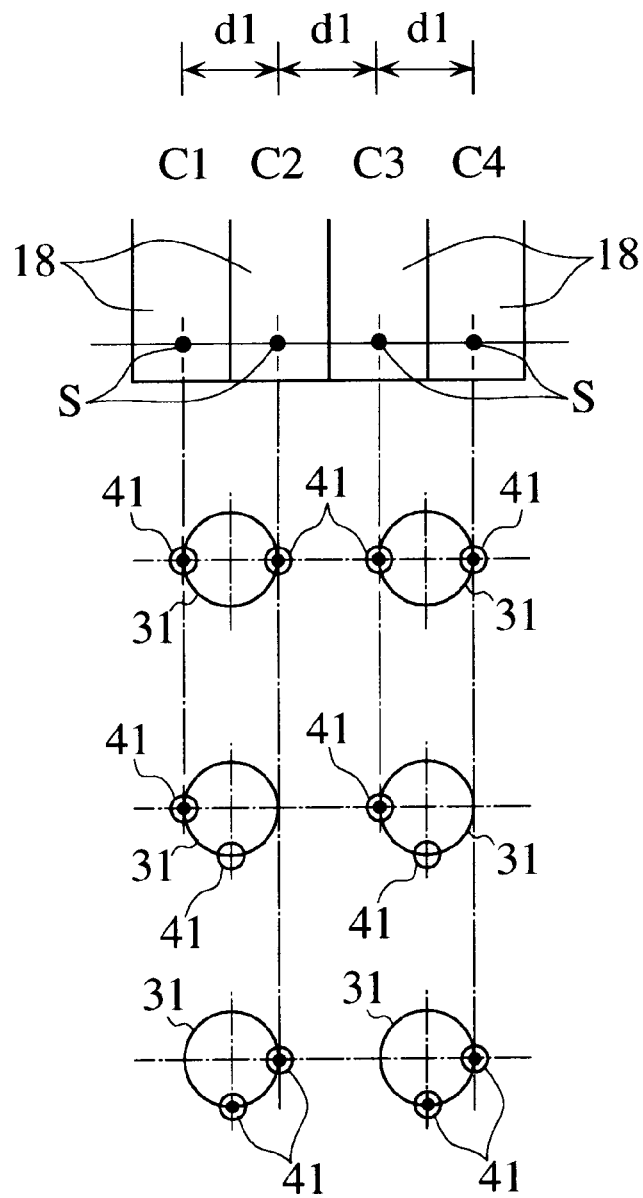
FIGS. 10A to 10D are plan views showing other patterns of positions of sucking nozzles selected for simultaneously sucking electronic components.

FIG. 10B shows a case where the two sucking nozzles 41, 41 positioned at diametrically opposite locations are used. In this variation, the pair of disengaging members are arranged on diametrically opposite locations of the mounting head 31. First, a total of four sucking nozzles 41, 41, 41, 41 of mounting heads 31, 31 adjacent to each other are rotated such that they are aligned on a row of four tape cassettes parallel with each other. In this state, the four sucking nozzles 41, 41, 41, 41 are spaced from each other by the distance d1, and electronic components S are simultaneously sucked from C1 to C4 cassettes 18, 18, 18, 18.

On the other hand, FIGS. 10C and 10D show a case where two sucking nozzles arranged at respective locations of each mounting head 31 shifted from each other by an angle of 90 degrees about the vertical axis thereof. In this variation, the aforementioned pair of disengaging members are arranged at respective locations of the mounting head 31 shifted from each other by an angle of 90 degrees about the vertical axis thereof. First, one sucking nozzle 41 of each of the mounting heads 31 is rotated to a left-hand position as viewed in FIG. 10C whereby electronic components S are simultaneously sucked from C1 and C3 tape cassettes 18, 18. Then, the other sucking nozzle 41 of each of the mounting heads is rotated to a right-hand position as viewed in FIG. 10D whereby electronic components are simultaneously sucked from C2 and C4 tape cassettes 18, 18. In this case, when one sucking nozzle 41 of each mounting head 31 sucks an electronic component S, the other sucking nozzle 41 is positioned away from the tape cassettes so as not to interfere with same, whereby simultaneous sucking of electronic components can be carried out by two-step simultaneously-sucking operations.

As shown in FIGS. 4A and 4C, even when the sucking nozzles are retracted, tips thereof are slightly protruded from the nozzle holder 41. Therefore, by constructing the vacuum passage 48 such that a desired sucking nozzle can be selectively communicated therewith, a sucking nozzle having an electronic component sucked thereat can be retracted without releasing the sucked electronic component. Therefore, when one sucking nozzle carries out sucking of an electronic component, the other may be retracted to a position away from the tape cassettes to thereby avoid interference with the tape cassettes 18. That is, in FIG. 10B, the sucking nozzles at the left-hand positions of the mounting heads 31 are projected, and at the same time the sucking nozzles at the right-hand positions of the same are retracted. In this state, first, electronic components S are simultaneously sucked from the C1 and C3 tape cassettes 18, 18, and then the sucking nozzles 41 at the left-hand positions are retracted and at the same time the sucking nozzles 41 at the right-hand positions are projected, whereby electronic components S are simultaneously sucked from the C2 and C4 tape cassettes 18, 18. Thus, simultaneous sucking of electronic components can be carried out by two-step simultaneously-sucking operations.

As described above, by employing not only the method of simultaneously sucking electronic components but also the method of sucking them by divisional simultaneously-sucking operations, it is possible to markedly reduce the times of traveling of the head units 9, 10 between the tape cassettes 18 and the circuit board T to thereby reduce the tact time of mounting electronic components S.

Figure 11:
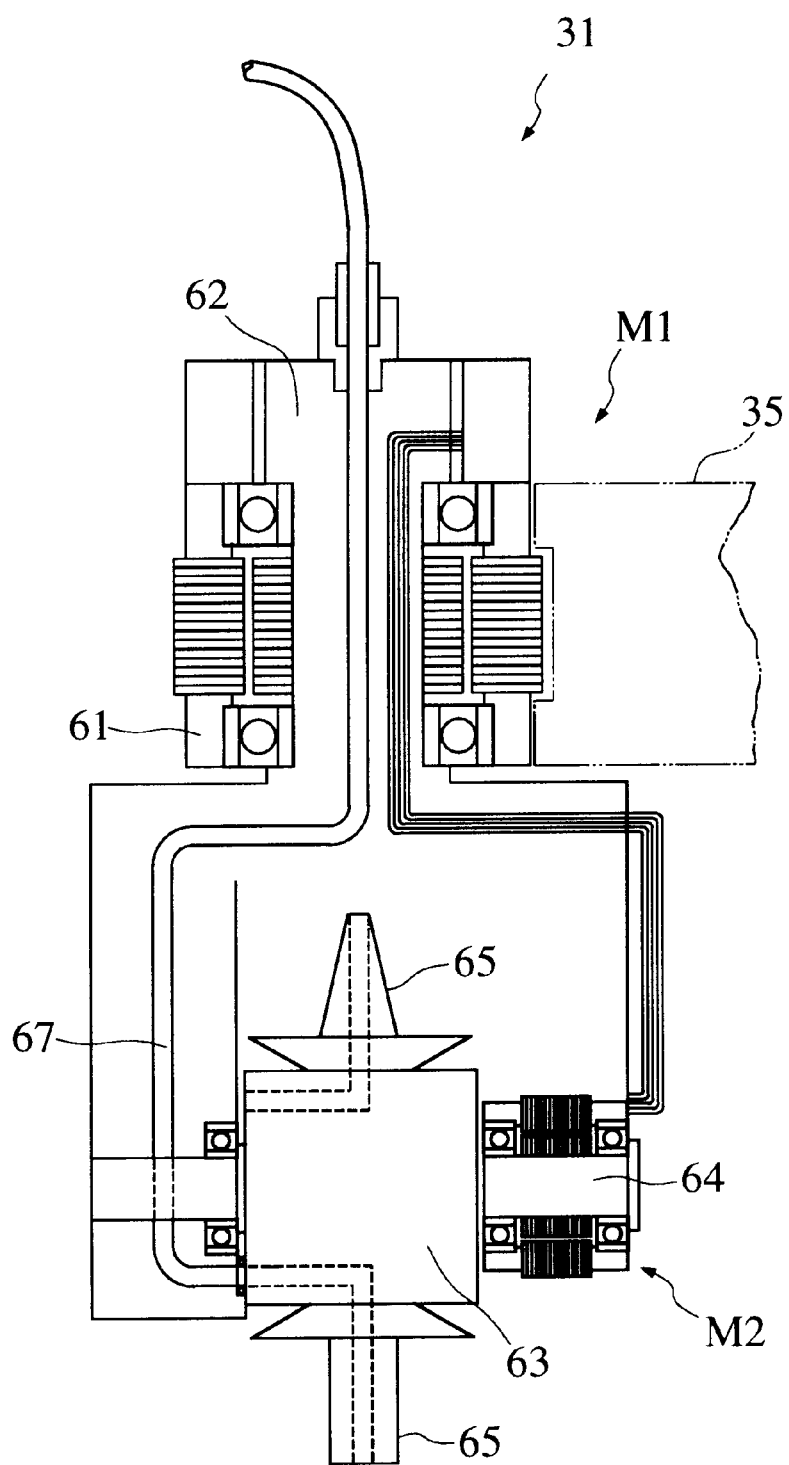
FIG. 11 is a cross-sectional view of a mounting head according to a second embodiment of the invention.

Next, a second embodiment of the invention will be described with reference to FIG. 11. This embodiment is distinguished from the first embodiment in construction of the mounting head 31. The remainder of the arrangement of the present embodiment is identical with the first embodiment, and hence description thereof is omitted. Reference numeral 35 designates a support block of the actuator unit 33 on which a first stepping motor M1 is mounted. The first stepping motor M1 has a housing 61 as a stator, and a rotary arm 62 as a rotor. The rotary arm 62 is rotated about the vertical axis thereof. The rotary arm 62 has lower part formed into two forked portions between which a horizontal shaft 64 rotatably extends with a nozzle holder 63 arranged thereon.

The nozzle holder 63 has a peripheral surface on which a plurality of sucking nozzles 65, 65 are arranged in a manner projecting in radial directions. Arranged between one end of the horizontal shaft 64 of the nozzle holder 63 and a lower end of one of the forked portions of the rotary arm 62 is a second stepping motor M2 which includes the one end of the horizontal shaft 64 as a rotor and the lower end of one of the forked portions of the rotary arm 62 as a stator. Therefore, the nozzle holder 63 is rotated about the longitudinal axis of the horizontal shaft 64 through a predetermined rotational angle according to the number of pulses of a pulse signal supplied to the second stepping motor M2. This enables the mounting head 31 to selectively replace one sucking nozzle 65 by another for use, independently, i.e. without being driven by an external device.

Further, the rotary arm 62 has a vacuum passage 67 formed therethrough for communication with only a sucking nozzle 65 selected and facing downward to thereby enable the sucking nozzle to suck an electronic component by vacuum. In the first embodiment, selection of a sucking nozzle and setting of an angular position of the sucking nozzle 41 can be effected by one motor. In the second embodiment, however, the two kinds of rotating operations require respective motors. Therefore, when each motor has a large weight, the first embodiment is advantageous over the second embodiment.

As described above, according to the second embodiment, even when the mounting head 31 (head units 9, 10) are in motion, it is possible to carry out selective replacement of sucking nozzles, and hence reduce time for replacement of sucking nozzles. As a result, it is possible to minimize the tact time of mounting electronic components S on the circuit board T, and markedly reduce the tact time of the whole process carried out by the electronic component-mounting apparatus 1 of multi-function type.

Next, a third embodiment of the invention will be described with reference to FIGS. 12 to 14.

This embodiment is distinguished from the first and second embodiments in constriction of the mounting head. The remaining arrangement is identical with the preceding embodiments, and hence detailed description thereof is omitted.

Figure 12:
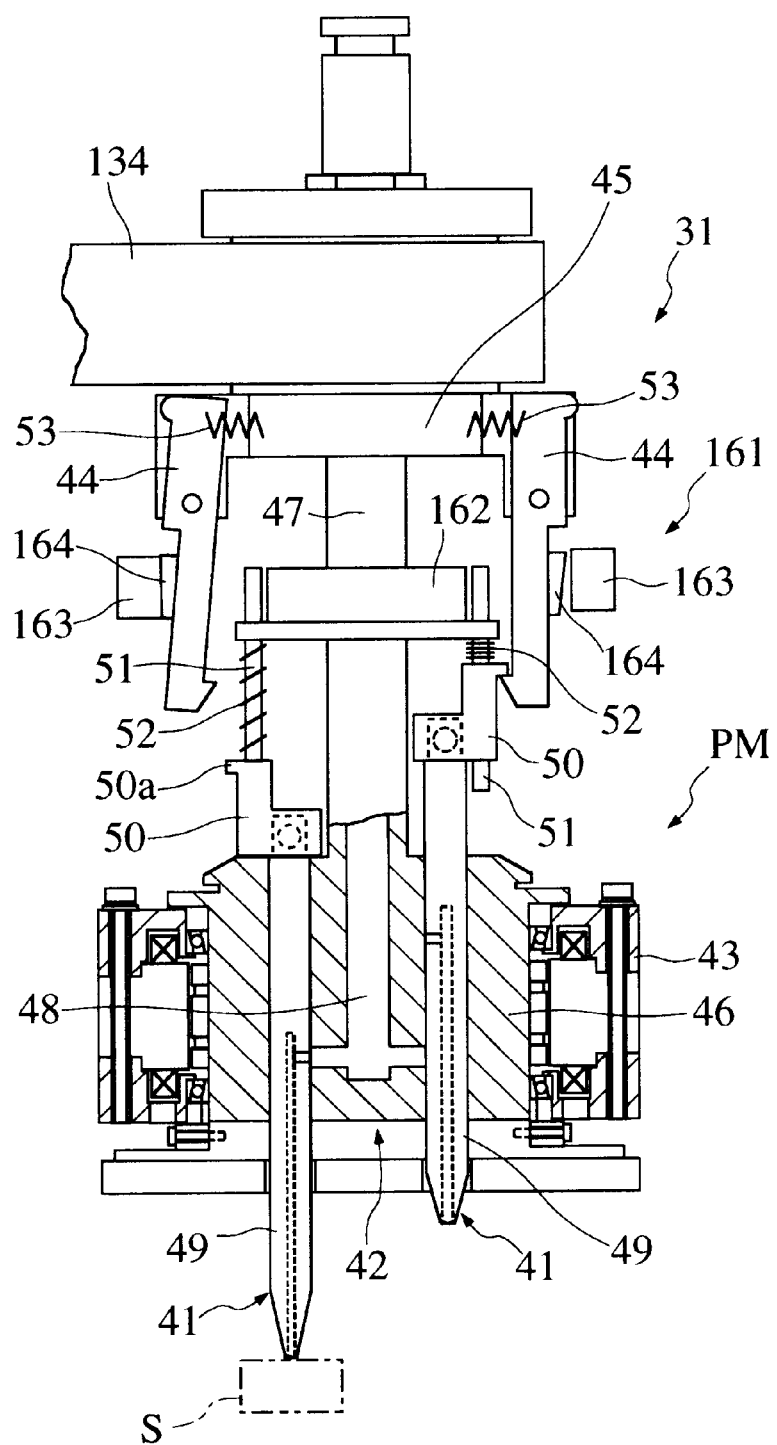
FIG. 12 is a partly sectional side elevation of a mounting head of an electronic component-mounting apparatus according to a third embodiment of the invention.

As shown in FIG. 12, each mounting head 31 is comprised of a nozzle holder 42 having four sucking nozzles 41 arranged at circumferentially spaced intervals such that each of them can project downward and retract upward, a housing 43 enclosing the nozzle holder 42, four engaging hooks (engaging member) 44 engageable with the sucking nozzles 41, respectively, a hook holder 45 (engaging member holder) supporting the engaging hooks 44, and a disengaging mechanism 161 (disengaging means) for disengaging the engaging hook 44 from the sucking nozzle 41 associated therewith.

The nozzle holder 42 is comprised of a holder body 46, and a spline shaft 47 integral with and extending upward from the holder body 46. A vacuum passage 48 extends through the central portions of the holder body 46 and the spline shaft 47 along the vertical axis. Further, the vacuum passage 48 has four branched end portions extending radially outward for communication with the inside of each sucking nozzle 41 only when it is projected outward or downward.

On the other hand, between the nozzle holder 42 and the housing 43, there is arranged a stepping motor PM (rotating means) which includes the nozzle holder 42 as a rotor and the housing 43 as a stator. Therefore, the nozzle holder 42 rotates relative to the housing 43 through a predetermined angle according to the number of steps of a pulse signal supplied thereto. This enables a selected sucking nozzle 41 to be brought to a desired position. Further, since the spline shaft 47 of the nozzle holder 42 is in spline engagement with the hook holder 45, the hook holder 45 is rotated in unison with the nozzle holder 42 and at the same time the two members 42, 45 are vertically movable relative to each other.

It should be noted that in place of the stepping motor PM, there may be used a servo motor which carries sucking nozzles 41 on the rotor thereof such that each of them can be lifted upward or lowered downward.

As described above, the sucking nozzles 41 are arranged in the nozzle holder 42 which serves as the rotor, and therefore the sucking nozzles 41 can be rotated more accurately with less backlash through degrees of an angle instructed to the stepping motor PM than in the case of the spline shaft 47 is rotated by way of a belt by an electric motor arranged on a location of each of the head units 9, 10 other than a location of the stepping motor PM. Further, the above construction of the nozzle holder 42 as the rotor is advantageous in that the head units 9, 10 can be constructed without increasing the weight thereof, and designed in compact. This advantage is more marked as the number of heads 31 mounted on the head units 9, 10 is increased.

Each sucking nozzle 41 is comprised of a nozzle body 49, and a hook catch 50 arranged on an upper end of the nozzle body 49. The nozzle body 49 is removably mounted on the hook catch 50. A guide rod 51 extends from a rod holder 162 fixed to the spline shaft 47 through the hook catch 50. Between the hook catch 50 and the rod holder 162, a coiled spring is interposed such that it is wound around the guide rod 51. The sucking nozzle 41 is urged downward or in a projecting direction by the coiled spring 52. The bottom of the hook catch 50 abuts on the top of the holder body 46 when it is brought to a lower most position, whereby the downward motion of the sucking nozzles 41 relative to the holder body 46 is restricted.

The hook catch 50 has an engaging portion 50a formed at an upper end thereof in a manner protruded radially outward, for engagement with or disengagement from the engaging hook 44. The engaging hook 44 is pivotally mounted on the hook holder 45, and at the same time urged in an engaging direction by a spring 53 interposed between the hook holder 45 and itself.

As shown in FIGS. 12 and 13, the disengaging mechanism 161 is arranged such that it encloses the engaging hooks 44. The disengaging mechanism 161 is comprised of eight electromagnets 163 arranged at circumferentially spaced intervals. Each electromagnet 163 has a ring portion 163a formed of magnetic material, such as iron, a core portion 163b protruded radially outward from the ring portion 163a, and a coil 163c wound around the core portion 163b. The energization of electromagnets 163 is controlled by an electromagnet control device, not shown, whereby they are excited (magnetized) and degaussed (demagnetized) independently of each other. On the other hand, on an outer surface of the engaging hook 44, an attracting member 164 formed of magnetic material, such as iron, is mounted at a location opposed to a corresponding one of the electromagnets 163. According to the above arrangement, when one of the electromagnets 163 is excited by energization of the coil 163c, the magnetism of the electromagnet 163 attracts the attracting member 164 opposed thereto to thereby cause the engaging hook 44 to be pivotally moved to the electromagnet 163. Thus, the engaging hook can be disengaged from the engaging portion 50a of the hook catch 50.

Although in the present embodiment, the disengaging mechanism 161 is formed of eight electromagnets, this is not limitative, but assuming that four sucking nozzles 41 are used, the minimum five electromagnets 163 surrounding the engaging hooks 44 can disengage even one of the engaging hooks 44 positioned to face a boundary between the two electromagnets 163. Further, it is possible to prevent other engaging hooks from being unnecessarily disengaged.

The mounting head 31 constructed as above is mounted on the support arm 30 as shown in FIGS. 14A to 14C. That is, in a manner corresponding to each mounting head 31, on the support frame 30, there are arranged an actuator unit 33 (elevating means) incorporating a linear motor, not shown, a stopper arm 134, and a support block 35. The support block 35 is lifted or lowered by the actuator unit 33 along a guide 136. The mounting head 31 is fixed to the support block 35 at a portion of the housing 43, and hence it is moved in unison with the support block 35 by the actuator unit 33. The stopper arm 134 restricts the upward movement of the mounting head 31 of the hook holder 45.

Next, referring to FIGS. 13A, 13B, and FIGS. 14A to 14C, the operation of the mounting head 31 constructed as above will be described. FIGS. 14A to 14C show a sequence of operations of the mounting head from a step of sucking an electronic component S by a sucking nozzle 41 thereof from the second component-feeding block 5, to a step of mounting the electronic component on the circuit board T. FIG. 14A shows a state of the mounting head 31 immediately after an electronic component S is sucked by projecting a sucking nozzle 41 on a right-hand side as viewed in the figure. In doing this, first, the nozzle holder 42 is held in a lifted position (as shown in FIG. 14B) by the actuator unit 33 whereby all the sucking nozzles 41 are projected from the nozzle holder 42.

Then, the head unit 9 is moved by the first X-Y stage 7 to bring the sucking nozzle 41 on the right-hand side selected for sucking to a position exactly above a predetermined tape cassette 18 at the second component-feeding block 5. If the sucking nozzle 41 deviates from its proper position slightly, the nozzle holder 42 can be rotated through a small angle to correct the position of the sucking nozzle 41. Then, only the electromagnet corresponding to the sucking nozzle 41 (one 163 on the right-hand side appearing in FIG. 14A) is excited by the electromagnet control device, not shown. The magnetism of the electromagnet 163 attracts the attracting member 164 thereto, whereby the engaging hook 44 is pivotally moved to the electromagnet 163 and attached thereto. This disengages the engaging hook 44 on the right-hand side from the engaging portion 50a of the hook catch 50.

Then, the actuator unit 33 is operated to lower the nozzle holder 42. The sucking nozzle 41 on the right-hand side disengaged from the engaging hook 44 corresponding thereto is lowered by the urging force of the coiled spring 52 to move after the nozzle holder 42 whereby it maintains a state projected from the nozzle holder 42. On the other hand, the other sucking nozzles 41 are prevented from lowering by the engaging hooks 44 respectively in engagement therewith, and held at respective lifted positions. As a result, they are retracted into the nozzle holder 41 (see FIG. 14A). This causes only the sucking nozzle 41 on the right-hand side to be projected, and thereafter, the nozzle holder 42 is further lowered to suck an electronic component S by the projected sucking nozzle 41 (see FIG. 14A). As is clear from the above operations of the mounting head 31, the coiled spring 52 interposed between the hook catch 50 and the rod holder 62 does not directly cause the sucking nozzle 41 to be projected from the nozzle holder 42, but causes the same to follow or move after the downward motion of the nozzle holder 42, and serves as a cushion for absorbing a shock which can occur when each sucking nozzle 41 sucks an electronic component or mounts the sucked electronic component S on the circuit board T.

Then, when the sucking of another electronic component by another sucking nozzle 41 is carried out, first, the exited or magnetized electromagnet 163 is demagnetized, and at the same time, the nozzle holder 42 is moved upward. As the nozzle holder 42 is moved upward, the hook catch 50 on the right-hand side causes the engaging hook 44 to be pivotally moved counterclockwise against the urging force of the spring 53, and then the hook catch 50 engages with the engaging hook 44. From this state, when sucking is carried out by a sucking nozzle 41 on a left-hand side as viewed in the figure, for example, similarly to the above, this sucking nozzle 41 is brought to a position exactly above a selected tape cassette 18 and then a corresponding electromagnet 163 (one 163 on the left-hand side appearing in FIG. 14C) alone is excited, followed by lowering the nozzle holder 42. By repeatedly carrying out the above operations, it is possible to cause all the four sucking nozzles 41 to suck selected electronic components S thereat.

Figure 13A:
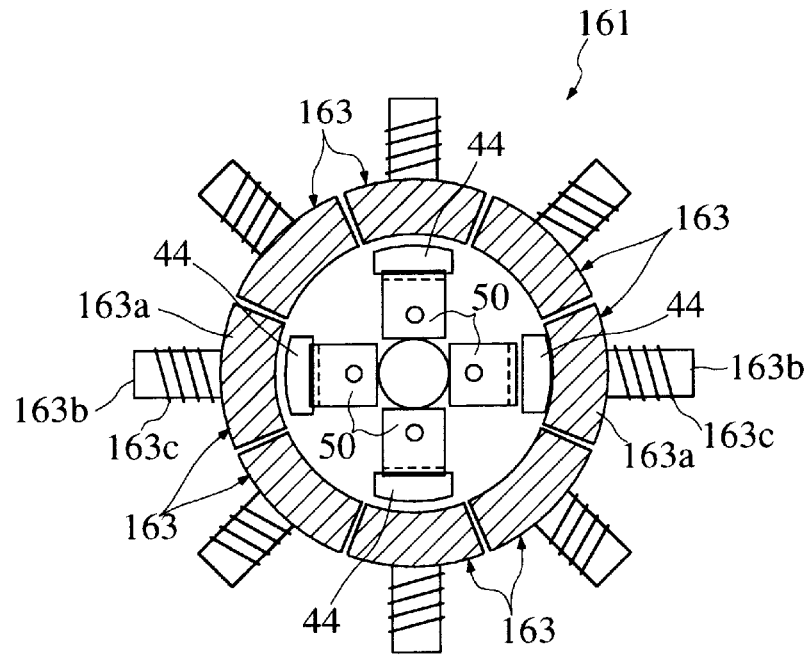
FIGS. 13A and 13B are horizontal sectional views of the FIG. 12 mounting head.
Figure 13B:
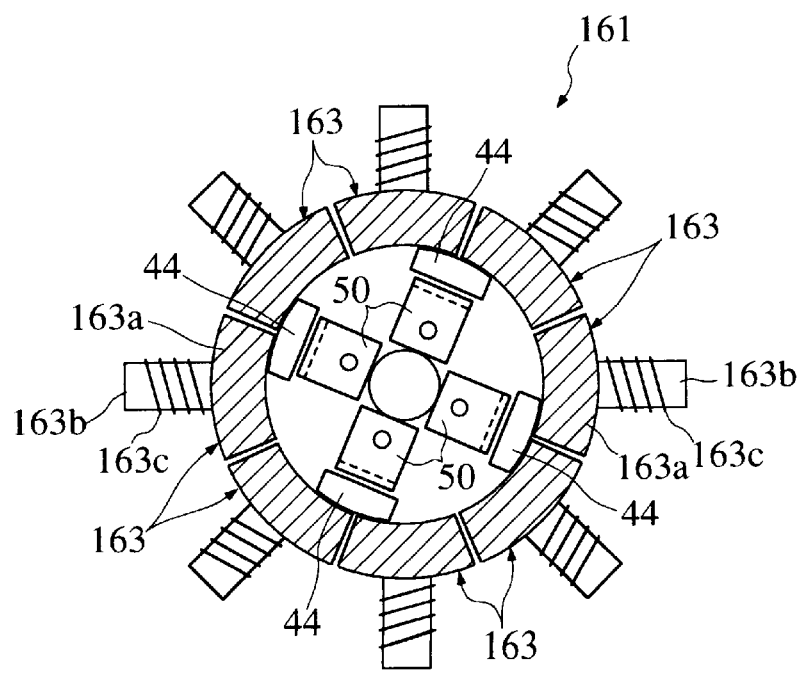

In the example illustrated in FIG. 13A, the engaging hook 44 engaged with the sucking nozzle 42 selected for use is opposed to one electromagnet 163, so that the former 44 is magnetized by the latter 163 alone. Depending on the rotational position of the nozzle holder 42 and the engaging hooks 44, as shown in FIG. 13B, one engaging hook 44 can be opposed to two electromagnets 163, 163 in a manner spreading across a gap between them. In such a case, the two electromagnets 163, 163 may be simultaneously excited to thereby disengage the engaging hook 44 from the hook catch 50 corresponding thereto with ease.

Further, as shown in FIG. 14A, if conditions of simultaneously sucking electronic components S by two sucking nozzles 41, 41 are fulfilled, e.g. if the distance between the sucking nozzles 41, 41 is equal to a pitch or distance between tape cassettes 18, 18 containing electronic components S to be sucked, the engaging hooks 44, 44 can be simultaneously disengaged by simultaneously magnetizing the electromagnets 163, 163 corresponding to these sucking nozzles 41, 41, to thereby enable these sucking nozzles 41, 41 to carrying simultaneous sucking.

After sucking electronic components S by all the sucking nozzles 41, the mounting head or the head unit is moved on a horizontal plane with the nozzle holder 42 held in a lifted state to bring the sucking nozzles to a position exactly above a position for mounting one of the electronic components on the circuit board T. In this case as well, the deviation of the position of each sucking nozzle 41 can be corrected by a slight rotation of the nozzle holder 42.

FIGS. 14B, 14C show a case where the sucking nozzle 41 on the left-hand side mounts an electronic component sucked thereat on a circuit board T. After positioning of the sucking nozzle 41, similarly to the case of sucking, the electromagnet 163 corresponding thereto is excited or magnetized to thereby disengage the engaging hook 44 (see FIG. 14B) from the hook catch 50, and then the nozzle holder 42 is lowered to thereby retract the other sucking nozzles 41. Then, the projected sucking nozzle 41 on the left-hand side is operated to mount the electronic component S on the circuit board T. Thereafter, the same operation is repeatedly carried out to cause the other sucking nozzles 41 to mount the remaining electronic components S on the circuit board T, thereby completing the mounting of the electronic components S on the circuit board T.

As described above, according to the electronic component-mounting apparatus 1 of the present embodiment, by lowering the nozzle holder 42, only a sucking nozzle 41 which is disengaged from an corresponding engaging hook 44 is caused to be projected out to thereby suck and mount an electronic component S. The disengagement of the sucking nozzle 41 from the engaging hook 44 corresponding thereto can be carried out instantly by exciting (magnetizing) selected one of eight electromagnets 163 regardless of the rotational angle of the nozzle holder 42 and the hook holder 45. Therefore, compared with the case of rotating the nozzle holder 44 and the hook holder 45 to disengage the sucking nozzle 41 from the engaging hook 44 corresponding thereto, a time period required in disengaging the sucking nozzle 41 from the engaging hook 44 can be shortened, to thereby reduce the tact time of mounting electronic components S.

Further, when simultaneous sucking of electronic components by a plurality of sucking nozzles 41 is carried out, it is possible to instantly disengage the plurality of sucking nozzles 41 from the engaging hooks 44 by simultaneously magnetizing a plurality of corresponding electromagnets 163. Therefore, the time period required in the disengagement of the engaging hooks 44 can be further reduced, to thereby further reduce the tact time of mounting electronic components.

Figure 15A:
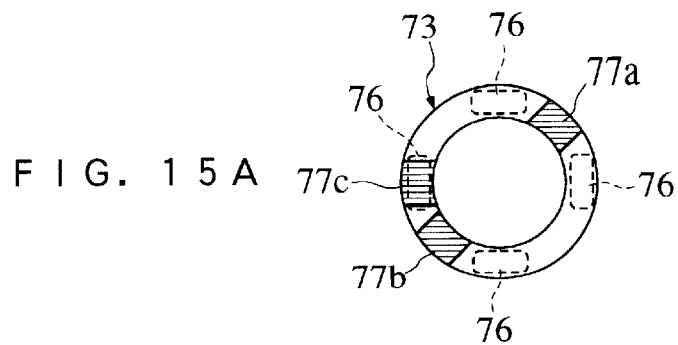
FIG. 15A is a plan view of a hollow cylindrical cam used in a mounting head of an electronic component-mounting apparatus according to a fourth embodiment of the invention.
Figure 15B:
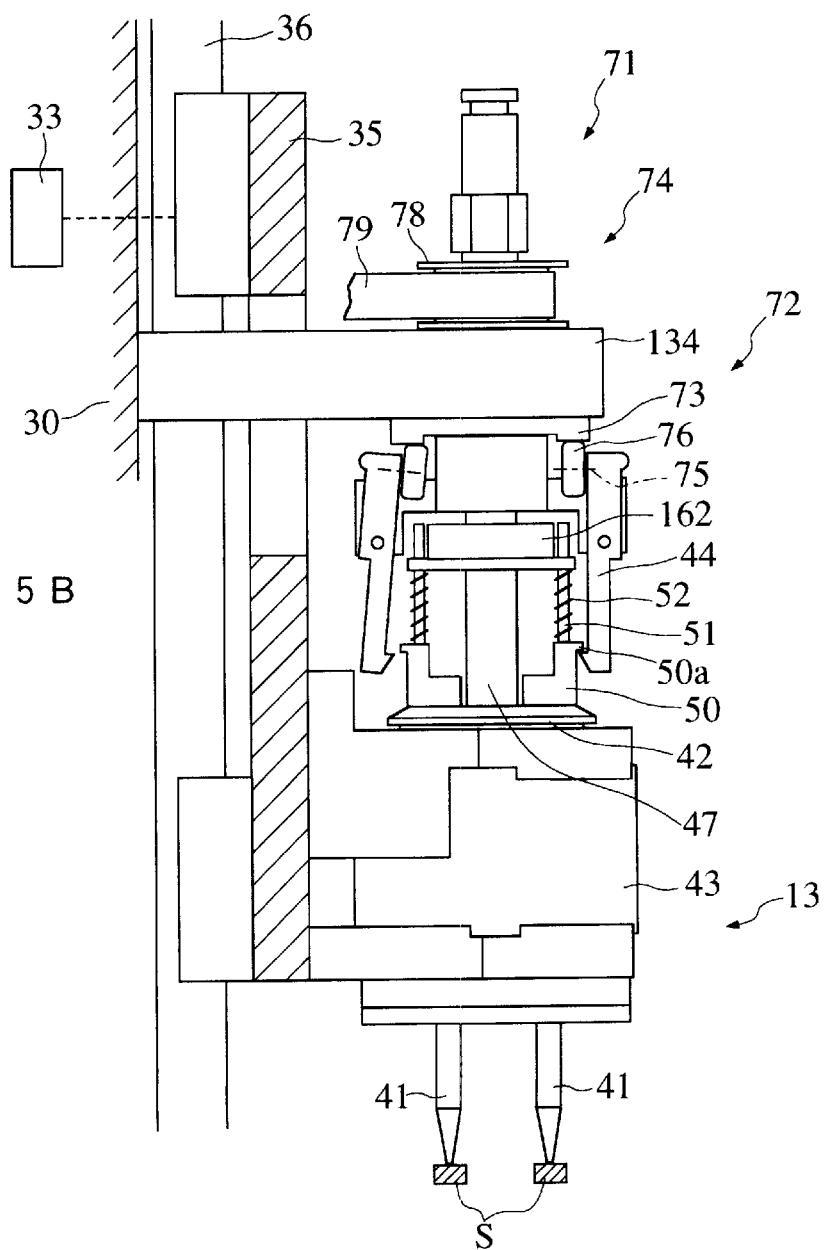
FIG. 15B is a side elevation of the mounting head of the electronic component-mounting apparatus according to the fourth embodiment of the invention.

FIG. 15B shows essential parts of an electronic component-mounting apparatus according to a fourth embodiment of the invention. This embodiment is distinguished from the third embodiment in that as the disengaging mechanism for disengaging a sucking nozzle 41 from an engaging hook 44 corresponding thereto, a cam mechanism is employed in place of the electromagnet 163. More particularly, a disengaging mechanism 72 (disengaging means) is comprised of a hollow cylindrical cam 73 which is rotatable about its vertical axis common to a nozzle holder 42, and a cam drive mechanism 74 (cam drive means) for rotating the hollow cylindrical cam 73 to a desired rotational angle position.

The hollow cylindrical cam 73 is placed on a roller 76 which is rotatably mounted on the inside of each engaging hook 44 by a pin 75, and as shown in FIG. 15A, it has its bottom formed with three protruding portions 77a, 77b, 77c. The protruding portions 77a and 77b are arranged at diametrically opposite locations, and the remaining protruding portion 77c is located at a location other than one remote from the protruding portions 77a and 77b by an angle of 90 degrees about the vertical axis of the hollow cylindrical cam 73.

The cam drive mechanism 74 is comprised of a belt 79 stretching between a pulley 78 integrally formed with the hollow cylindrical cam 73 and a stepping motor, not shown, for driving the belt 79. Therefore, by controlling the number of steps of a pulse signal supplied to the stepping motor, the hollow cylindrical cam 73 can be rotated to a desired angular position. The remaining arrangement of the electronic component-mounting apparatus is identical with that of the first embodiment.

According to the above arrangement, by operating the stepping motor, the rotation of the hollow cylindrical cam 73 can be controlled, whereby at least one of the protruding portions 77a, 77b, and 77c can be brought into contact with the roller 76 of a desired engaging hook 44. Accordingly, the engaging hook 44 mounted on the roller 76 abutting on the protruding portion 77a, 77b or 77c is pivotally moved in a direction opposite to an engaging direction, whereby the sucking nozzle 41 corresponding thereto is disengaged from the engaging hook 44.

Further, as is apparent from the arrangement of the protruding portions 77a, 77b, and 77c, the protruding portion 77c is used for disengaging only one sucking nozzle, while the protruding portions 77a and 77b are used for simultaneously disengaging two sucking nozzles 41. That is, when the protruding portion 77c is brought into contact with a roller 76 corresponding to a single sucking nozzle 41, the other protruding portions 77a and 77b are away from the other rollers 76, whereby the single sucking nozzle 41 and the corresponding engaging hook 44 alone can be disengaged from each other. FIG. 15B shows a state in which the protruding portion 77c is brought into contact with the roller 76 corresponding thereto to cause only the left-hand sucking nozzle 41 to be projected out.

On the other hand, when two protruding portions 77a, 77b are brought into contact with rollers 76, 76 of two engaging hooks 44, 44 in engagement with two sucking nozzles 41, 41 at diametrically opposite locations, the protruding portion 77c is made away from the other rollers 76, whereby the two sucking nozzles 41 and the corresponding engaging hooks 44 can be disengaged from each other.

As described above, according to the present embodiment, by rotating the hollow cylindrical cam 73, one or a plurality of sucking nozzles can be disengaged instantly from corresponding engaging hook(s) regardless of rotational angular positions of the nozzle holder 42 and the hook holder 45 relative to each other. Therefore, in the same manner as the first embodiment, time required for disengagement can be reduced and the tact time of mounting electronic components S on the circuit board T can be shortened.

The present invention is not limited to the above embodiments, but it can be practiced in various ways. For example, although in the third and fourth embodiments, one mounting head carries four sucking nozzles, this is not limitative, but the number of sucking nozzles can be increased or decreased as required. In such a case, according to the increased or decreased number of sucking nozzles, the number of electromagnets in the third embodiment, and the number of protruding portions of the hollow cylindrical cam in the fourth embodiment can be increased or decreased.

It is further understood by those skilled in the art that the foregoing are preferred embodiments of the invention, and that various changes and modification may be made without departing from the spirit and scope thereof.

What is claimed is:

1. An electronic component-mounting apparatus for sucking electronic components at a sucking position and mounting said electronic components on a circuit board at a mounting position, the electronic component-mounting apparatus comprising:

a component-feeding block for feeding a plurality of electronic components to the sucking position;

a component-mounting block for selectively sucking at least one of said electronic components at said sucking position of said component-feeding block and mounting said at least one of said electronic components having been sucked on a circuit board at the mounting position, said component-mounting block having a plurality of mounting heads thereon, at least one of said plurality of mounting heads having
  a plurality of sucking nozzles for sucking a corresponding one of said electronic components from said component-feeding block and,
  a nozzle-replacing device for effecting replacement of at least one selected sucking nozzle of said plurality of sucking nozzles by at least one other sucking nozzle of said plurality of sucking nozzles to be newly selected; and a moving stage having X and Y moving stages each for moving said component-mounting block in a respective X and Y direction between the sucking position and the mounting position to mount a component on the circuit board at the mounting position and for moving the component-mounting block back to the sucking position, wherein said nozzle-replacing device replaces said at least one selected sucking nozzle of said plurality of sucking nozzles by at least one other sucking nozzle of said plurality of sucking nozzles to be newly selected during travel of said component-mounting block between said mounting position and said sucking position.

2. An electronic component-mounting apparatus according to claim 1, wherein said nozzle-replacing device lifts upward said at least one selected sucking nozzle and projects downward said at least one other sucking nozzle to be newly selected, to thereby replace the former by the latter.

3. An electronic component-mounting apparatus according to claim 2, wherein said at least one of said plurality of mounting heads has a nozzle holder which has said plurality of sucking nozzles arranged circumferentially about a vertical axis thereof, and an electric motor for rotating said nozzle holder about said vertical axis thereof.

4. An electronic component-mounting apparatus according to claim 1, wherein said component-mounting block has elevating means for vertically moving each of said plurality of mounting heads such that said each of said mounting heads is vertically moved with reference to a level of a bottom surface of each of said respective electronic components having been sucked by said each of said mounting heads.

5. An electronic component-mounting apparatus according to claim 1, wherein said component-feeding block has means for feeding said plurality of electric components in an aligned manner at intervals of an identical distance, thereby permitting a plurality of ones of said plurality of electronic components to be selectively simultaneously sucked, and wherein said component-mounting block has said plurality of mounting heads installed thereon in parallel with said plurality of electronic components arranged in said aligned manner, in a manner such that a pitch of arrangement of said plurality of mounting heads is an integral multiple of said identical distance.

6. An electronic component-mounting apparatus according to claim 5, wherein said at least one of said plurality of mounting heads having said plurality of sucking nozzles has a nozzle holder which has said plurality of sucking nozzles arranged circumferentially about a vertical axis thereof, and an electric motor for rotating said nozzle holder about said vertical axis thereof, said sucking nozzles each rotating on a circular path of rotation having a diameter larger than said identical distance of said plurality of electronic components.

7. An electronic component-mounting apparatus according to claim 1, wherein said component-feeding block feeds a plurality of kinds of electronic components, and wherein said at least one of said plurality of mounting heads has a plurality of sucking nozzles corresponding to a plurality of selected kinds of said plurality of kinds of electronic components.

8. An electronic component-mounting apparatus according to claim 1, wherein said at least one of said plurality of mounting heads having said plurality of sucking nozzles has a nozzle holder which has said plurality of sucking nozzles arranged in a manner projecting in a radial direction about a horizontal axis thereof, and a rotating means for rotating said nozzle holder about said horizontal axis thereof.

9. An electronic component-mounting apparatus according to claim 1, wherein said at least one of said plurality of mounting heads has a nozzle holder which has said plurality of sucking nozzles arranged circumferentially about a horizontal axis thereof, and an electric motor for rotating said nozzle holder about said horizontal axis.

10. An electronic component-mounting apparatus as in claim 1 wherein a said mounting head comprises:

a nozzle holder, a plurality of sucking nozzles arranged along an identical circle about a vertical axis of said nozzle holder and held by said nozzle holder in a manner capable of projecting and retracting vertically, an engaging member holder, a plurality of engaging members each held by said engaging member holder in a manner engageable with said plurality of sucking nozzles, respectively, and rotating means for rotating said nozzle holder and said engaging member holder about said vertical axis of said nozzle holder.

11. An electronic component-mounting apparatus as in claim 10 further comprising:

elevating means for vertically moved said nozzle holder and said engaging member holder away from each other, to thereby retract ones of said sucking nozzles in engagement with corresponding ones of said engaging members into said nozzle holder, and disengaging means for disengaging at least one of said plurality of sucking nozzles and a corresponding one of said engaging members from each other at an arbitrary desired rotational angle position of said nozzle holder and said engaging member holder.

12. An electronic component-mounting apparatus for sucking electronic and mounting said electronic components on a circuit board, the electronic component-mounting apparatus comprising:

a component-feeding block for feeding a plurality of electronic components to a sucking position;

component-mounting block for selectively sucking at least one of said electronic components at said sucking position of said component-feeding block, and mounting said at least one of said electronic components having been sucked on a circuit board at a mounting position, said component-mounting block each having a plurality of mounting heads installed thereon, at least one of said plurality of mounting heads having at least one sucking nozzle mounted thereon in a manner rotatable about a vertical axis of said at least one mounting head;

a moving stage having X and Y moving stages each for moving said component-mounting block in a respective X and Y direction between said sucking position and said mounting position and back to said sucking position; and said component-mounting block includes a nozzle replacing device for replacement of the sucking nozzle with another nozzle as said component-mounting block is moved from said mounting position back to said sucking position.

13. An electronic component-mounting apparatus for sucking electronic components and mounting said electronic components on a circuit board, the electronic component-mounting apparatus comprising:

a component-feeding block for feeding at least one electronic component to a sucking position; and a mounting head for selectively sucking at least one of said at least one electronic component at said sucking position of said component-feeding block and then moving on a horizontal plane to mount said at least one electronic component having been sucked, on a circuit board at a mounting position, said mounting head having:

a nozzle holder, a plurality of sucking nozzles arranged along an identical circle about a vertical axis of said nozzle holder and held by said nozzle holder in a manner capable of projecting and retracting vertically, an engaging member holder, a plurality of engaging members each held by said engaging member holder in a manner engageable with said plurality of sucking nozzles, respectively, rotating means for rotating said nozzle holder and said engaging member holder about said vertical axis of said nozzle holder, elevating means for vertically moved said nozzle holder and said engaging member holder away from each other, to thereby retract ones of said sucking nozzles in engagement with corresponding ones of said engaging members into said nozzle holder, and disengaging means for disengaging at least one of said plurality of sucking nozzles and a corresponding one of said engaging members from each other at an arbitrary desired rotational angle position of said nozzle holder and said engaging member holder.

14. An electronic component-mounting apparatus according to claim 13 wherein said disengaging means is capable of simultaneously disengaging at least two of said plurality of sucking nozzles from corresponding ones of said engaging members.

15. An electronic component-mounting apparatus according to claim 13, wherein said plurality of sucking nozzles comprise four sucking nozzles arranged circumferentially at intervals of an identical distance.

16. An electronic component-mounting apparatus according to claim 13, wherein each of said plurality of engaging members is held by said engaging member holder in a manner pivotally movable about a horizontal pivot thereof and urged in an engaging direction for engagement with a corresponding one of said sucking nozzles, said each of said engaging members having at least part of an outer surface thereof formed by a magnetic substance, said disengaging means having a plurality of electromagnets arranged circumferentially in a manner opposed to said magnetic substance of said each of said engaging members, for pivotally moving a selected one of said engaging members in a direction opposite to said engaging direction when one of said electromagnets corresponding to said selected one of said engaging members is excited, to thereby attract said selected one of said engaging members by way of said magnetic substance thereof, and electromagnet control means for controlling magnetization/demagnetization of said plurality of electromagnets independently of each other.

17. An electronic component-mounting apparatus according to claim 16, wherein said plurality of electromagnets are formed by electromagnets larger in number than a number of said plurality of sucking nozzles.

18. An electronic component-mounting apparatus according to claim 13, wherein each of said plurality of engaging members is held by said engaging member holder in a manner pivotally movable about a horizontal pivot thereof and urged in an engaging direction for engagement with a corresponding one of said sucking nozzles, said engaging members having a plurality of rotatable rollers, respectively, said disengaging means having a cam which is rotatable about said vertical axis of said nozzle holder in sliding contact with said plurality of rollers, said cam being formed with a plurality of protruding portions on a sliding surface thereof in sliding contact with said rollers, for pivotally moving selected one of said engaging members in a direction opposite to said engaging direction when one of said rotatable rollers of said selected one of said engaging members is brought into contact with one of said protruding portions of said cam, and cam-driving means for moving said cam to a desired rotational angle position.

19. An electronic component-mounting apparatus according to claim 18, wherein said plurality of sucking nozzles are formed by four sucking nozzles arranged circumferentially at intervals of an identical distance, and wherein said plurality of protruding portions of said cam are formed by two protruding portions formed at diametrically opposite locations thereof and one other protruding portion formed at a location other than locations circumferentially spaced from said two protruding portions by an angle of 90 degrees.

20. An electronic component-mounting apparatus for sucking electronic components and mounting said electronic components on a circuit board, the electronic component-mounting apparatus comprising:

a component-feeding block for feeding a plurality of electronic components to a sucking position;

a component-mounting block for selectively sucking at least one of said electronic components at said sucking position of said component-feeding block, and mounting said at least one of said electronic components having been sucked, on a circuit board at a mounting position, said component-mounting block having a plurality of mounting heads installed thereon; and an X-Y moving stage for moving said component-mounting block between said sucking position and said mounting position, each of said mounting heads having:
a nozzle holder,
a plurality of sucking nozzles arranged along an identical circle about a vertical axis of said nozzle holder and held by said nozzle holder in a manner capable of projecting and retracting vertically,
an engaging member holder,
a plurality of engaging members each held by said engaging member holder in a manner engageable with said plurality of sucking nozzles, respectively,
rotating means for rotating said nozzle holder and said engaging member holder about said vertical axis of said nozzle holder,
elevating means for vertically moved said nozzle holder and said engaging member holder away from each other, to thereby retract ones of said sucking nozzles in engagement with corresponding ones of said engaging members into said nozzle holder, and
disengaging means for disengaging at least one of said plurality of sucking nozzles and a corresponding one of said engaging members from each other at an arbitrary desired rotational angle position of said nozzle holder and said engaging member holder.

* * * * *